United States Patent
Kim

(10) Patent No.: US 12,408,507 B2
(45) Date of Patent: Sep. 2, 2025

(54) DISPLAY DEVICE

(71) Applicant: LG Display Co., Ltd., Seoul (KR)

(72) Inventor: Heekwan Kim, Paju-si (KR)

(73) Assignee: LG Display Co., Ltd., Seoul (KR)

(*) Notice: Subject to any disclaimer, the term of this patent is extended or adjusted under 35 U.S.C. 154(b) by 461 days.

(21) Appl. No.: 18/065,349

(22) Filed: Dec. 13, 2022

(65) Prior Publication Data

US 2023/0200108 A1 Jun. 22, 2023

(30) Foreign Application Priority Data

Dec. 22, 2021 (KR) .................. 10-2021-0185235

(51) Int. Cl.
*H01L 29/08* (2006.01)
*H10K 50/824* (2023.01)
*H10K 59/122* (2023.01)

(52) U.S. Cl.
CPC ......... *H10K 50/824* (2023.02); *H10K 59/122* (2023.02)

(58) Field of Classification Search
CPC ............................ H10K 59/122; H10K 50/824
USPC .......................................................... 257/40
See application file for complete search history.

(56) References Cited

U.S. PATENT DOCUMENTS

| | | | |
|---|---|---|---|
| 9,859,520 B2 | 1/2018 | Kim | |
| 10,644,269 B2* | 5/2020 | Lee | H10K 50/816 |
| 11,716,877 B2 | 8/2023 | Heo | |
| 2016/0149155 A1 | 5/2016 | Kim | |
| 2018/0062109 A1* | 3/2018 | Kim | H10K 50/824 |
| 2018/0120620 A1 | 5/2018 | Shim et al. | |
| 2020/0136068 A1 | 4/2020 | Lee et al. | |
| 2020/0194510 A1* | 6/2020 | Shin | H10K 59/123 |
| 2021/0175304 A1* | 6/2021 | Lee | H10K 59/88 |

FOREIGN PATENT DOCUMENTS

| | | |
|---|---|---|
| CN | 113097407 A | 7/2021 |
| EP | 3136440 A1 | 3/2017 |
| EP | 3316311 A1 | 5/2018 |
| JP | 2017-199675 A | 11/2017 |
| KR | 10-2016-0062646 A | 6/2016 |
| KR | 20170063326 A | 6/2017 |

\* cited by examiner

*Primary Examiner* — Phuc T Dang
(74) *Attorney, Agent, or Firm* — Seed Intellectual Property Law Group LLP

(57) ABSTRACT

A cathode electrode is brought into contact with an auxiliary electrode via an undercut defined below an overhang structure, based on a difference between deposition characteristics of an organic light-emitting layer and the cathode electrode, thereby reducing electrical resistance of the cathode electrode. Accordingly, occurrence of low-potential power rise (VSS rise) is reduced due to the reduced electrical resistance of the cathode electrode, such that occurrence of luminance non-uniformity of the display device is reduced.

33 Claims, 15 Drawing Sheets

Normal case

Defective case

Normal case

Defective case

DISPLAY DEVICE

CROSS-REFERENCE TO RELATED APPLICATION

This application claims priority from Korean Patent Application No. 10-2021-0185235 filed on Dec. 22, 2021, which is hereby incorporated by reference in its entirety.

BACKGROUND

Technical Field

The present disclosure relates to a display device capable of reducing luminance non-uniformity.

Description of the Related Art

A display device may be implemented in various forms, such as a liquid crystal display device (LCD), an organic light-emitting display device (OLED), a micro LED display device, and the like.

The organic light-emitting display device includes an organic light-emitting element as a self-emissive element, and thus does not require a separate light source, thereby greatly reducing a thickness and a weight of the display device.

The organic light-emitting display device may have a structure in which an organic light-emitting element for emitting light is disposed between an anode electrode and a cathode electrode.

An area in which the organic light-emitting element contacts the anode electrode and the cathode electrode may be a light-emitting area.

The organic light-emitting display device may be classified into a bottom emission OLED in which light emitted from the light-emitting area travels toward a substrate, a top emission OLED in which light emitted from the light-emitting area travels in a direction away from the substrate, a dual emission OLED in which light emitted from the light-emitting area travels toward the substrate and in a direction away from the substrate, and a transparent OLED.

BRIEF SUMMARY

In the top emission OLED or the dual emission OLED, transmittance of the cathode electrode as an upper electrode disposed on a top face of the organic light-emitting element may be increased in order that light emitted from the light-emitting area travels in an upward direction.

For example, the cathode electrode may be embodied as a transmissive electrode or a semi-transmissive electrode.

Even in the transparent OLED including the light-emitting area and a light-transmissive area, the cathode electrode may be embodied as a substantially transparent electrode in order to realize the light-transmissive area.

Accordingly, the cathode electrode may be made of a material having high transmittance. In general, the material having a high transmittance has a high electrical resistance.

Further, in order to improve the transmittance of the cathode electrode, a thickness of the cathode electrode may be decreased. When the thickness of the cathode electrode decreases, the electrical resistance of the cathode electrode increases.

When the electrical resistance of the cathode electrode is increased as described above, low-potential power rise (VSS rise phenomenon) may occur such that luminance of the display device may become non-uniform.

Accordingly, the inventors of the present disclosure have invented a display device capable of reducing the low-potential power rise (VSS rise phenomenon) through various experiments, thereby reducing the luminance non-uniformity phenomenon.

One or more embodiments of the present disclosure provide a display device capable of reducing the luminance non-uniformity phenomenon.

One or more embodiments of the present disclosure provide a display device capable of reducing occurrence of deformation, tearing, or lifting defects of each of layers, in a contact area between a cathode electrode and an auxiliary electrode.

One or more embodiments of the present disclosure provide a display device having a structure in which a cleaning process on a contact area between a cathode electrode and an auxiliary electrode may be easily performed.

One or more embodiments of the present disclosure provide a display device capable of reducing occurrence of static electricity in a contact area between a cathode electrode and an auxiliary electrode.

One or more embodiments of the present disclosure provide a display device capable of reducing poor contact between a cathode electrode and an auxiliary electrode while not being affected by movement and directionality of a substrate during a process.

One or more embodiments of the present disclosure provide a display device having an auxiliary electrode structure capable of facilitating contact between an auxiliary electrode and a cathode electrode in a contact area between the cathode electrode and the auxiliary electrode.

Technical benefits of the present disclosure are not limited to the above-mentioned benefits. Other benefits and advantages of the present disclosure that are not mentioned may be understood based on following descriptions, and may be more clearly understood based on embodiments of the present disclosure. Further, it will be easily understood that the purposes and advantages of the present disclosure may be realized using means shown in the claims and combinations thereof.

The display device according to an embodiment of the present disclosure includes a substrate; an auxiliary electrode disposed on the substrate; a passivation layer disposed on the auxiliary electrode and having a first hole defined therein through which at least a portion of the auxiliary electrode is exposed; an overcoat layer disposed on the passivation layer and having a second hole defined therein through which the at least a portion of the auxiliary electrode is exposed; and a bank layer disposed on the overcoat layer and having a third hole defined therein through which the at least a portion of the auxiliary electrode is exposed.

In this case, the first hole, the second hole, and the third hole are arranged such that at least portions thereof overlap each other in a plan view of the display device, wherein a middle area in a first direction of the first hole overlaps a middle area in a second direction of the second hole, wherein the first direction intersects the second direction. The first direction may be a direction that is parallel to a long extension of the auxiliary electrode. The second direction may be perpendicular to the first direction.

Further, a display device according to an embodiment of the present disclosure includes a substrate; an auxiliary electrode disposed on the substrate; a passivation layer disposed on the auxiliary electrode; an overcoat layer disposed on the passivation layer; a bank layer disposed on the overcoat layer; an organic light-emitting layer disposed on the bank layer; and a cathode electrode disposed on the organic light-emitting layer.

In this case, the auxiliary electrode includes an auxiliary electrode contact, wherein at least a portion of the auxiliary electrode contact is exposed through holes respectively extending through the passivation layer, the overcoat layer, and the bank layer, wherein the organic light-emitting layer and the cathode electrode extend to the auxiliary electrode contact, wherein a portion of the overcoat layer surrounding the auxiliary electrode contact includes a pair of overcoat overhang structures.

According to an embodiment of the present disclosure, the cathode electrode is brought into contact with the auxiliary electrode, based on a difference between deposition characteristics of the organic light-emitting layer and the cathode electrode, and the overhang structure, such that the electrical resistance of the cathode electrode may be reduced.

Accordingly, according to an embodiment of the present disclosure, the occurrence of the low-potential power rise may be reduced by reducing the electrical resistance of the cathode electrode, such that the occurrence of the luminance non-uniformity of the display device may be reduced.

Further, according to an embodiment of the present disclosure, when the overhang structure for contacting the cathode electrode and the auxiliary electrode with each other is formed, the passivation layer, the overcoat layer, and the bank layer may be sequentially stacked, and the overcoat layer may include a pair of the overcoat overhang structures, and the bank protrusion may be disposed on each of the overcoat overhang structures.

Accordingly, according to an embodiment of the present disclosure, not the bank layer but the overcoat layer may be disposed on the passivation layer, thereby reducing the occurrence of tearing defects due to the adhesion problem between the bank layer and the passivation layer. The bank layer may be disposed on a top face of the overcoat layer, thereby reducing the occurrence of deformation of the overcoat layer due to the stress or the lift-off of the overcoat overhang structure due to the stress.

Further, according to an embodiment of the present disclosure, when the overhang structure for contacting the cathode electrode and the auxiliary electrode with each other is formed, the overhang structure is composed of the overcoat layer, and the bank layer is formed on the overcoat layer. Thus, a thickness of the overhang structure may be substantially increased, thereby forming a robust structure on which a cleaning process is easily performed.

Further, according to an embodiment of the present disclosure, when the overhang structure for contacting the cathode electrode and the auxiliary electrode with each other is formed, the overhang structure is composed of the overcoat layer made of a non-conductive material, and the bank layer is formed on the overcoat layer, thereby reducing the occurrence of static electricity defects that may occur in the area.

Further, according to an embodiment of the present disclosure, when the overhang structure for contacting the cathode electrode and the auxiliary electrode with each other is formed, the pair of undercuts are disposed respectively at opposing sides of a middle area of the hole of the passivation layer and are positioned in a symmetrical manner with each other. Thus, possibility of occurrence of defects according to the movement direction of the substrate in the process of forming the organic light-emitting layer may be reduced.

Further, according to an embodiment of the present disclosure, in a plan view of the display device, the hole of the passivation layer, the hole of the overcoat layer, and the hole of the bank layer are located inside an area corresponding to the auxiliary electrode having a planarized surface. Thus, the undercut may be disposed on the planarized surface of the auxiliary electrode. Thus, a curvature of the undercut area may be reduced and the cathode electrode may be in contact with the auxiliary electrode in a continuous manner.

Effects of the present disclosure are not limited to the above-mentioned effects, and other effects as not mentioned will be clearly understood by those skilled in the art from following descriptions.

DETAILED DESCRIPTIONS

Figure 1:
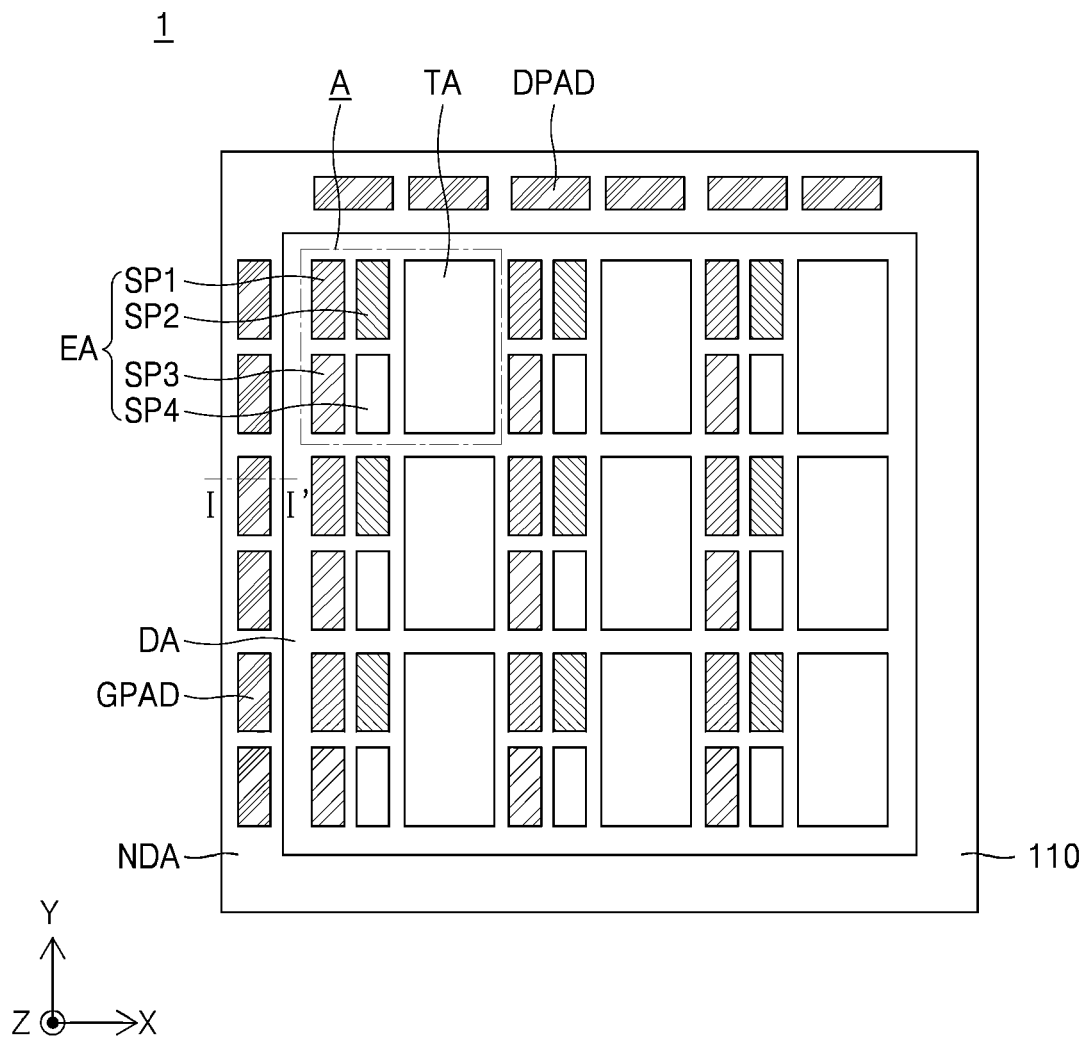
FIG. 1 is a plan view of a display device according to an embodiment of the present disclosure.

Advantages and features of the present disclosure, and a method of achieving the advantages and features will become apparent with reference to embodiments described later in detail together with the accompanying drawings. However, the present disclosure is not limited to embodiments as disclosed below, but may be implemented in various different forms. Thus, these embodiments are set forth only to make the present disclosure complete, and to completely inform the scope of the present disclosure to those of ordinary skill in the technical field to which the present disclosure belongs.

A shape, a size, a ratio, dimensions (e.g., length, width, height, thickness, radius, diameter, area, etc.), an angle, a number of elements, etc., disclosed in the drawings for describing the embodiments of the present disclosure are illustrative, and the present disclosure is not limited thereto. A dimension including size and a thickness of each component illustrated in the drawing are illustrated for convenience of description, and the present disclosure is not limited to the size and the thickness of the component illustrated, but it is to be noted that the relative dimensions including the relative size, location and thickness of the components illustrated in various drawings submitted herewith are part of the present disclosure.

The same reference numerals refer to the same elements herein. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

The terminology used herein is directed to the purpose of describing particular embodiments only and is not intended to be limiting of the present disclosure. As used herein, the singular constitutes "a" and "an" are intended to include the plural constitutes as well, unless the context clearly indicates otherwise. It will be further understood that the terms "comprise," "comprising," "include," and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify an entirety of list of elements and may not modify the individual elements of the list. In interpretation of numerical values, an error or tolerance therein may occur even when there is no explicit description thereof.

In addition, it will also be understood that when a first element or layer is referred to as being present "on" a second element or layer, the first element may be disposed directly on the second element or may be disposed indirectly on the second element with a third element or layer being disposed between the first and second elements or layers. It will be understood that when an element or layer is referred to as being "connected to," or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like may be disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like may be disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

It will be understood that, although the terms "first," "second," "third," and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

In interpreting a numerical value, the value is interpreted as including an error range although there is no separate explicit description thereof.

The features of the various embodiments of the present disclosure may be partially or entirely combined with each other, and may be technically associated with each other or operate with each other. The embodiments may be implemented independently of each other and may be implemented together in an association relationship.

In descriptions of temporal relationships, for example, temporal precedent relationships between two events such as "after," "subsequent to," "before," etc., another event may occur therebetween unless "directly after," "directly subsequent" or "directly before" is indicated.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, a display device according to embodiments of the present disclosure will be described in detail with reference to the accompanying drawings.

Hereinafter, various configurations of a display device capable of reducing luminance non-uniformity will be described in detail.

FIG. 1 is a plan view of a display device according to an embodiment of the present disclosure.

Hereinafter, an example in which the display device is embodied as a transparent organic light-emitting display device (OLED) including a light-transmissive area and a light-emitting area including an organic light-emitting element will be described. However, the display device according to an embodiment of the present disclosure is not limited thereto.

A display device 1 may include a substrate 110, and the substrate 110 may include a display area DA and a non-display area NDA disposed to surround the display area DA.

The display area DA may include at least one light-emitting area EA and at least one light-transmissive area TA arranged in a matrix form.

For example, the light-emitting area EA may include a first sub-pixel SP1, a second sub-pixel SP2, and a third sub-pixel SP3 rendering red R, green G, and blue B, respectively, or, may include the first sub-pixel SP1, the second sub-pixel SP2, the third sub-pixel SP3, and a fourth sub-pixel SP4 rendering red R, green G, blue B, and white W, respectively.

At least one data pad area DPAD and at least one gate pad area GPAD to which a data driver and a gate driver for applying various signals to the light-emitting area EA of the display area DA may be connected, respectively, may be disposed in the non-display area NDA.

Hereinafter, description is made with reference to FIG. 2, FIG. 3A to FIG. 3C.

Figure 2:
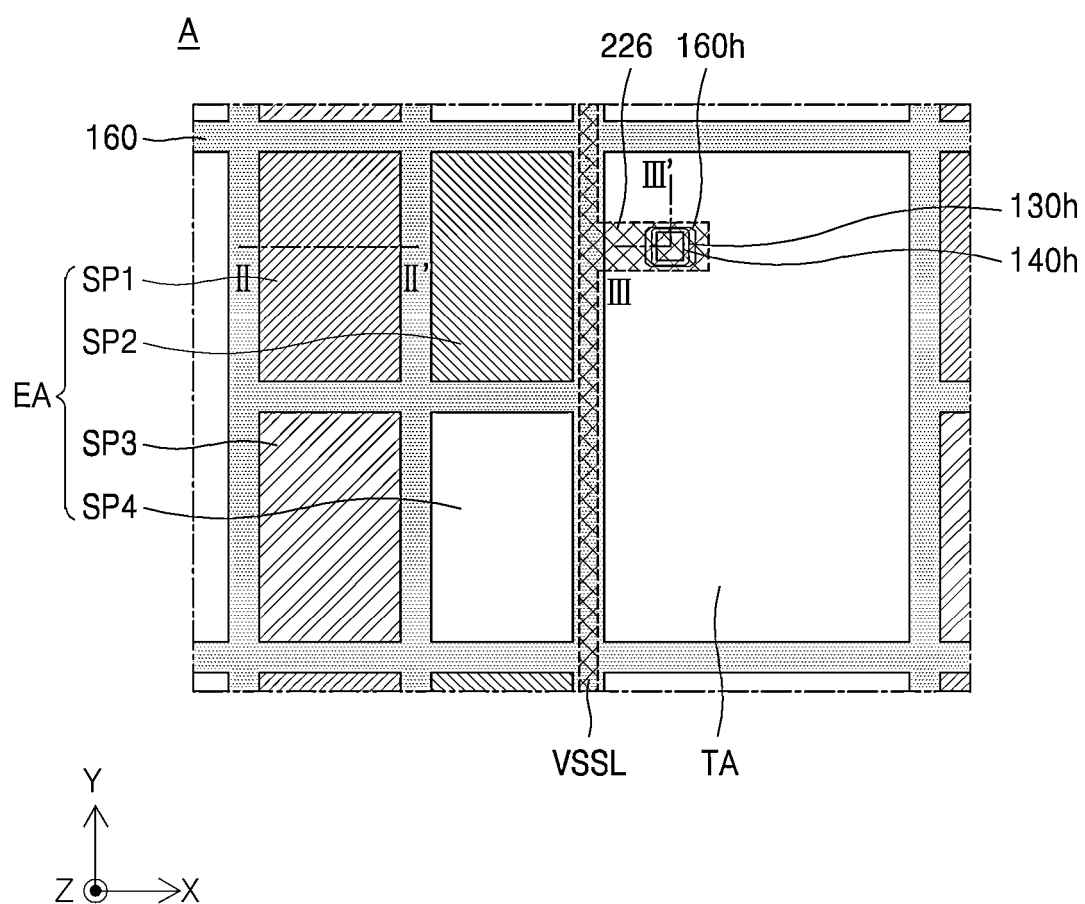
FIG. 2 is an enlarged plan view of a display device including a light-emitting area and a light-transmissive area according to an embodiment of the present disclosure.

FIG. 2 is an enlarged plan view of a display device including a light-emitting area and a light-transmissive area according to an embodiment of the present disclosure. Specifically, FIG. 2 is an enlarged plan view of region A of FIG. 1.

Figure 3A:
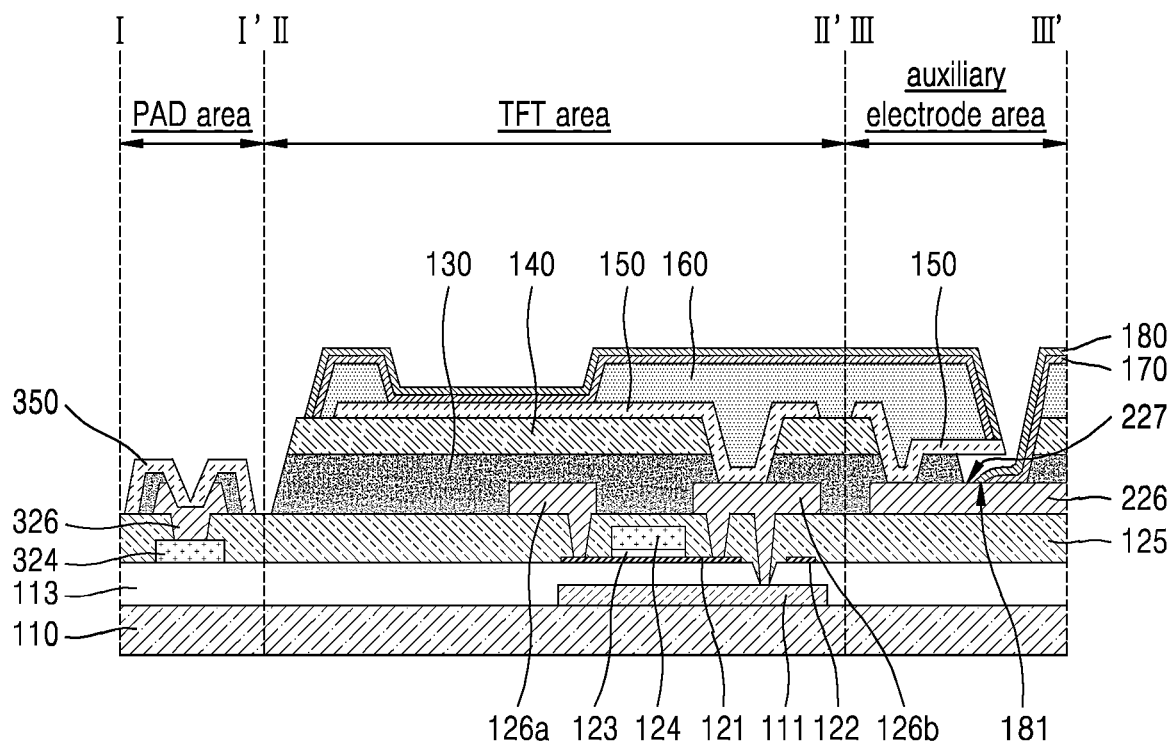
FIG. 3A is a cross-sectional view corresponding to a partial area of a display device according to an embodiment of the present disclosure.
Figure 3B:
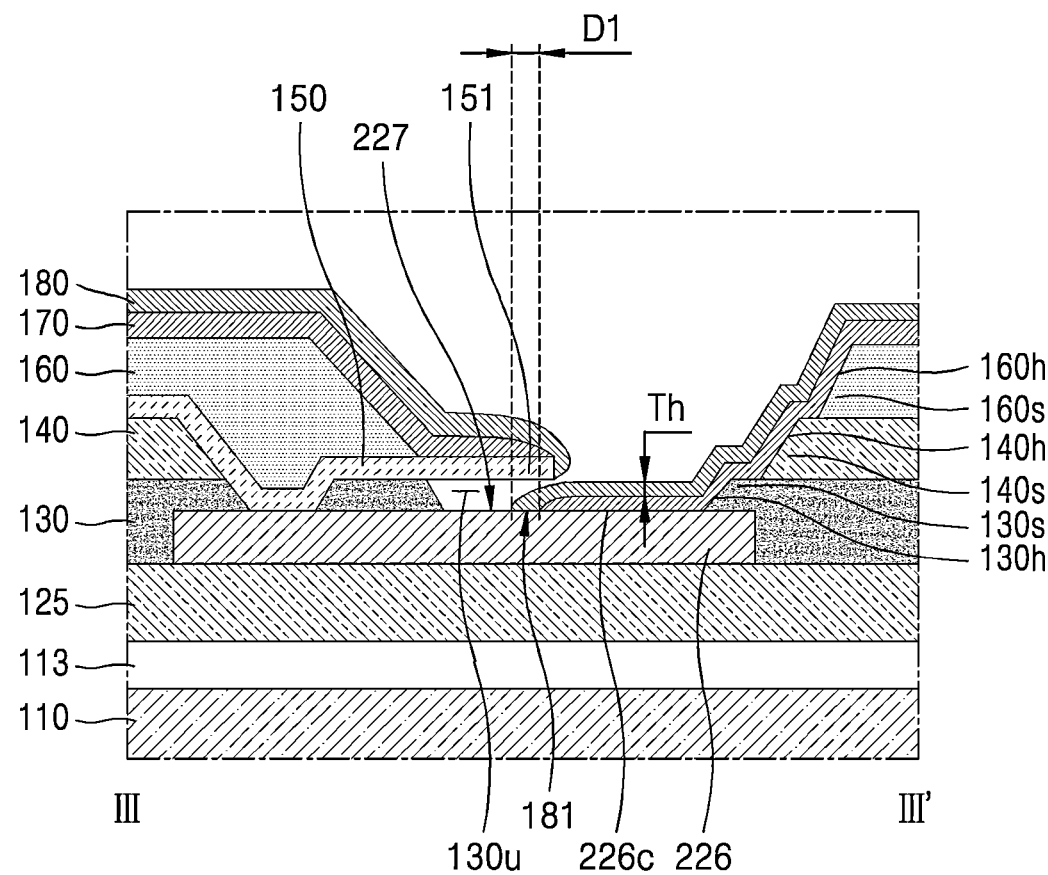
FIG. 3B is an enlarged cross-sectional view of an area corresponding to an auxiliary electrode area.
Figure 3C:
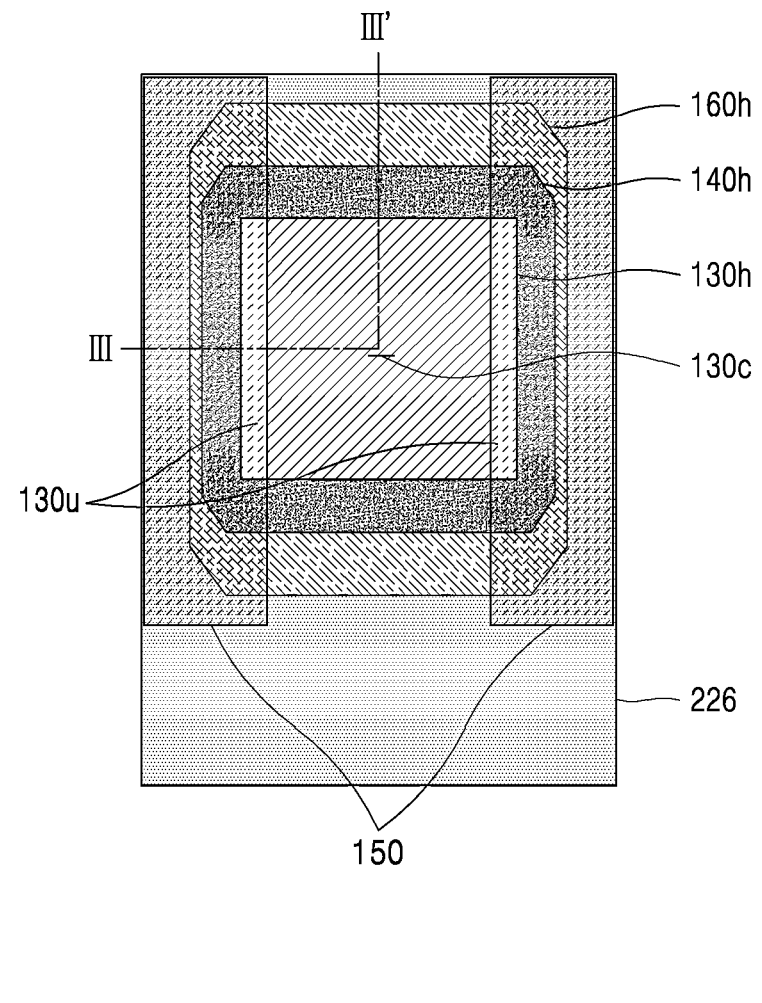
FIG. 3C is an enlarged plan view of the area corresponding to the auxiliary electrode area.

FIG. 3A is a cross-sectional view corresponding to a partial area of a display device according to an embodiment of the present disclosure. Specifically, FIG. 3A is a cross-sectional view along line I-I' of FIG. 1, and lines II-II' and III-III' of FIG. 2. FIG. 3B is an enlarged cross-sectional view of an area corresponding to the auxiliary electrode area. Specifically, FIG. 3B is an enlarged view of the cross-sectional view III-III' of FIG. 3A. FIG. 3C is an enlarged plan view of the area corresponding to the auxiliary electrode area.

The substrate 110 may act as a base substrate of display device 1, and may be embodied as a glass substrate. However, the present disclosure is not limited thereto, and a polyimide substrate having flexibility may be used as the substrate 10.

A pad area PAD area, a thin-film transistor area TFT area, and an auxiliary electrode area may be formed on the substrate 110.

The thin-film transistor area TFT area may include a light-emitting area EA.

A thin-film transistor TFT including an active layer 121, a gate electrode 124, a first electrode 126a, and a second electrode 126b may be disposed on the substrate 110 and in the thin-film transistor area TFT area.

A light-blocking layer 111 capable of preventing light from being incident on the active layer 121 of the thin-film transistor TFT may be disposed between the thin-film transistor TFT and the substrate 110.

A buffer layer 113 may be disposed between the light-blocking layer 111 and the thin-film transistor TFT.

A gate insulating layer 123 capable of electrically insulating the active layer 121 and the gate electrode 124 from each other may be disposed between the active layer 121 and the gate electrode 124.

A capacitor electrode 122 may be disposed in the same layer as a layer in which the active layer 121 is disposed and may overlap the light-blocking layer 111 and may constitute a capacitor.

An interlayer insulating layer 125 may be disposed on the active layer 121 and the gate electrode 124. A first electrode 126a and a second electrode 126b may be electrically connected to the active layer 121 via contact holes extending through the interlayer insulating layer 125, respectively.

The first electrode 126a may be a source electrode, and the second electrode 126b may be a drain electrode.

The second electrode 126b may be electrically connected to the light-blocking layer 111 via a contact hole extending through the interlayer insulating layer 125 and the buffer layer 113.

A light-emitting element including an anode electrode 150 electrically connected to the thin-film transistor TFT, an organic light-emitting layer 170, and a cathode electrode 180 may be disposed on the thin-film transistor TFT.

A passivation layer 130 made of an inorganic insulating material may be disposed between the thin-film transistor TFT and the anode electrode 150.

Further, an overcoat layer 140 made of an organic insulating material may be disposed between the passivation layer 130 and the anode electrode 150.

The overcoat layer 140 may function as a planarization layer, such that the electrodes and the layers disposed on the overcoat layer may be evenly formed on a planarized surface thereof.

The anode electrode 150 may be electrically connected to the second electrode 126b of the thin-film transistor TFT via a contact hole extending through the passivation layer 130 and the overcoat layer 140.

Light may be emitted from an area where the anode electrode 150, the organic light-emitting layer 170, and the cathode electrode 180 overlap each other. Thus, the area where the anode electrode 150, the organic light-emitting layer 170, and the cathode electrode 180 overlap each other may be defined as the light-emitting area EA.

Across the pixels, the organic light-emitting layer 170 may emit light of the same color such as white light. Alternatively, across the pixels, the organic light-emitting layer 170 may emit light of different colors such as red, green, and blue light.

A bank layer 160 may be disposed at a boundary between the light-emitting areas EA to reduce mixing between colors from the light-emitting areas EA displaying different colors.

The bank layer 160 may be made of an organic insulating material. The bank layer 160 may be made of an organic insulating material different from a material of the overcoat layer 140. However, the present disclosure is not limited thereto.

A sealing layer (not shown) may be additionally disposed on the light-emitting element to reduce penetration of moisture and foreign substances into the organic light-emitting layer 170.

The pad area PAD area will be described based on the gate pad area GPAD by way of example.

In the pad area PAD area, the buffer layer 113 may be disposed on the substrate 110, and a pad electrode 324 may be disposed on the buffer layer 113. The pad electrode 324 may be made of the same material as that of the gate electrode 124.

A pad connection electrode 326 may be disposed on the interlayer insulating layer 125 and may be electrically connected to the pad electrode 324 via a contact hole extending through the interlayer insulating layer 125.

The pad connection electrode 326 may be made of the same material as that of each of the first electrode 126a and the second electrode 126b.

A pad contact electrode 350 may be disposed on the passivation layer 130 and may be electrically connected to the pad connection electrode 326 via a contact hole extending through the passivation layer 130.

The pad contact electrode 350 may be made of the same material as that of the anode electrode 150.

Hereinafter, the auxiliary electrode area will be described.

In the display device 1 according to an embodiment of the present disclosure, light emitted from the organic light-emitting layer 170 may travel in a direction opposite to a direction toward the substrate 110, that is, may travel toward the cathode electrode 180.

Accordingly, a thickness of the cathode electrode 180 may be reduced in order to increase transmittance thereof.

The cathode electrode 180 may be, for example, made of a transparent conductive oxide (TCO) such as ITO (Indium Tin Oxide), IZO (Indium Zinc Oxide), ITZO (Indium Tin Zinc Oxide), etc., and may act as a transmissive electrode having a high transmittance or a semi-transmissive electrode.

However, when the thickness of the cathode electrode 180 is reduced, electrical resistance thereof increases. When the cathode electrode 180 is made of a material having high transmittance, the cathode electrode may have high electrical resistance.

When the electrical resistance of the cathode electrode 180 is increased as described above, the luminance of the display device may become non-uniform due to the low-potential power rise (VSS rise).

Accordingly, in the display device 1 according to the present disclosure, an auxiliary electrode 226 may be electrically connected to the cathode electrode 180, thereby reducing the electrical resistance of the cathode electrode 180.

Figure 4:
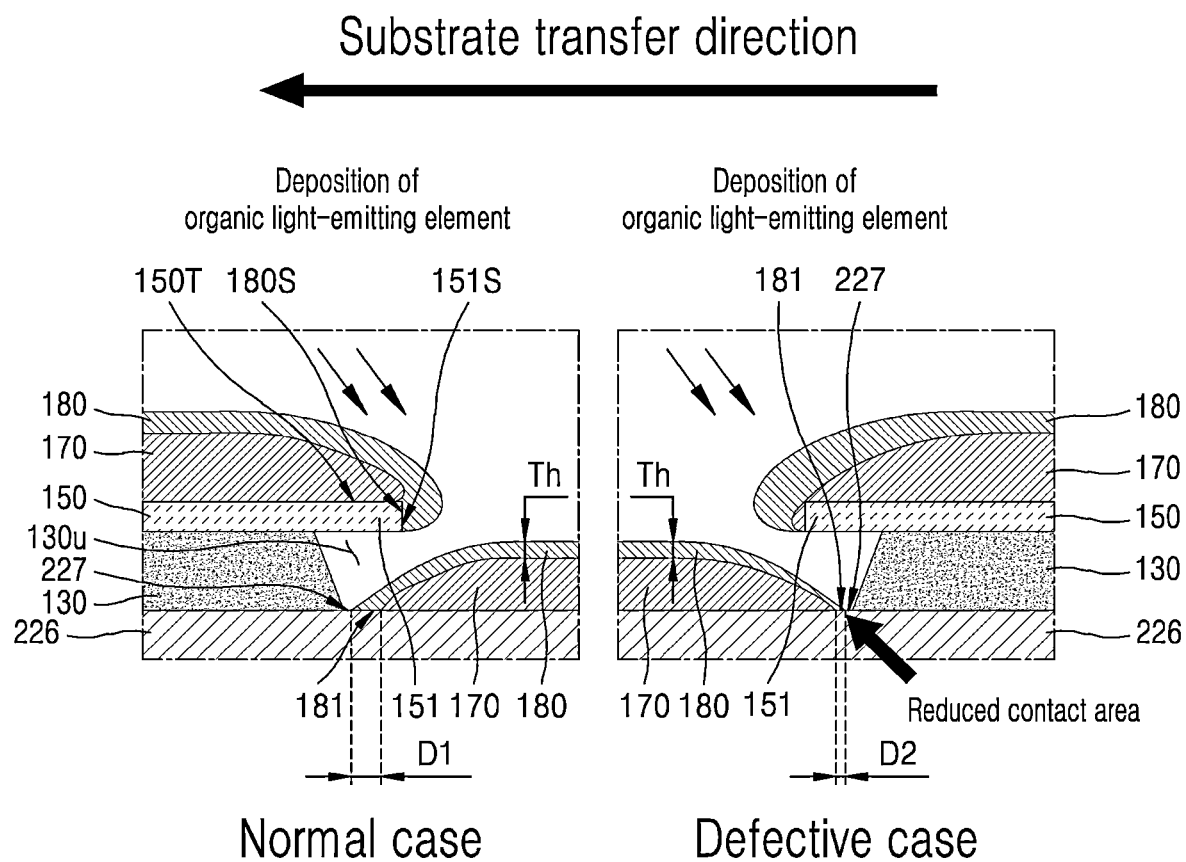
FIG. 4 is a diagram of comparison between a normal case and a defective case in terms of contact between an auxiliary electrode and a cathode electrode according to a transfer direction of a substrate of a display device.

The auxiliary electrode area may refer to an area where auxiliary electrode 226 is arranged. For example, the auxiliary electrode area may include an area where the cathode electrode 180 and the auxiliary electrode 226 directly contact each other. A side or end surface 181 of the cathode electrode 180 directly contacts a top surface 227 of the auxiliary electrode 226. The sufficient contact between the side surface 181 of the cathode electrode 180 and the top surface 227 of the auxiliary electrode 226 reduces the electrical resistance of the cathode electrode 180. This is shown in FIGS. 3A, 3B, and 4. In FIG. 4, it shows that under a 'normal case,' the side surface 181 of the cathode electrode 180 and the top surface 227 of the auxiliary electrode 226 have sufficient contact. However, under a 'defective case,' the side surface 181 of the cathode electrode 180 and the top surface 227 of the auxiliary electrode 226 still contact and make the electrical connection for reducing the electrical resistance of the cathode electrode 180. However, as shown, the contact area where the side surface 181 of the cathode electrode 180 contacts the top surface 227 of the auxiliary electrode 226 is reduced compared to the 'normal case.' Accordingly, this may result in a poor physical contact and/or poor electrical contact and may increase the electrical resistance of the contact to the cathode electrode 180.

In some embodiments, sufficient contact between the side surface 181 of the cathode electrode 180 and the top surface 227 of the auxiliary electrode 226 can be established if a distance D1 or length D1 of the side surface 181 of the cathode electrode 180 contacting the top surface 227 of the auxiliary electrode 226 is equal to or greater than a thickness Th of the cathode electrode 180. This is one example of a sufficient contact but the present disclosure is not limited to this one example. Referring to FIG. 4, in the defective case, a distance D2 or length D2 of the side surface 181 of the cathode electrode 180 contacting the top surface 227 of the auxiliary electrode 226 is smaller than a thickness Th of the cathode electrode 180. In the illustration of FIG. 4, the length D2 is significantly smaller than the thickness Th of the cathode electrode 180 and the contact area is significantly less than that of the normal case.

The buffer layer 113 and the interlayer insulating layer 125 may be disposed on the substrate 110 and in the auxiliary electrode area.

The auxiliary electrode 226 may be disposed on the interlayer insulating layer 125 and in the auxiliary electrode area.

The auxiliary electrode 226 may be disposed in the same layer as a layer in which the first electrode 126a and the second electrode 126b of the thin-film transistor TFT are disposed, and may be made of the same material as that of each of the first electrode 126a and the second electrode 126b of the thin-film transistor TFT.

The auxiliary electrode 226 may be made of copper (Cu), aluminum (Al), molybdenum (Mo), nickel (Ni), titanium (Ti), chromium (Cr), or an alloy thereof. However, the present disclosure is not limited thereto.

The passivation layer 130 having a first hole 130h defined therein may be disposed on the auxiliary electrode 226.

The overcoat layer 140 having a second hole 140h defined therein may be disposed on the passivation layer 130.

The second hole 140h may be formed to have a larger area than that of the first hole 130h, and the first hole 130h may be located inwardly of the second hole 140h.

Further, the anode electrode 150 including an anode overhang structure 151 may be disposed on the passivation layer 130.

A portion of the anode electrode 150 in the auxiliary electrode area may be a portion extending a portion of the anode electrode 150 in the light-emitting area EA. However, the present disclosure is not limited thereto. A separate electrode spaced apart from the anode electrode 150 in the light-emitting area EA may act as the anode electrode 150 in the auxiliary electrode area.

The anode electrode 150 in the auxiliary electrode area and the anode electrode 150 in the light-emitting area EA may be made of the same material and may be formed in the same process and may be disposed in the same layer.

The anode electrode 150 in the auxiliary electrode area may include the anode overhang structure 151 protruding inwardly of the first hole 130h of the passivation layer 130 by a predetermined distance (or, in some embodiments, any selected distance).

In FIG. 3B, the anode electrode 150 includes a first portion that contacts the top surface 227 of the auxiliary electrode 226. The first portion is referred to as the trench shaped portion or the recessed portion of the anode electrode 150 that electrically connects with the auxiliary electrode 226. The anode electrode 150 also includes a second portion that is spaced apart from the top surface 227 of the auxiliary electrode 226. The second portion is also referred to as the anode overhang structure 151. The first portion and the second portion are continuous and contiguous to each other.

An undercut 130u may be formed in a portion of the passivation layer 130 under the anode overhang structure 151 of the anode electrode 150.

Since the undercut 130u is formed inwardly of the first hole 130h, the undercut may correspond to an area where the passivation layer 130 has been partially removed.

Since the anode overhang structure 151 protrudes inwardly of the first hole 130h of the passivation layer 130, the undercut 130u may be an area which is screened with the anode overhang structure 151 and thus is not exposed to an outside in a top view.

The first hole 130h of the passivation layer 130 may include a first middle area 130c and a pair of undercuts 130u respectively disposed at opposing sides of the first middle area 130c.

The pair of undercuts 130u may be disposed at or adjacent to the first middle area 130c so as to face each other and may be respectively disposed at positions symmetrical to each other. For example, the pair of undercuts 130u may be disposed symmetrically with respect to a center of the first middle area 130c.

Further, the pair of undercuts 130u may be formed in the same shape and may respectively have shapes symmetrical to each other.

A bank layer 160 having a third hole 160h defined therein may be disposed on the anode electrode 150 and the overcoat layer 140.

The third hole 160h may be formed to have a larger area than that of each of the first hole 130h and the second hole 140h. The first hole 130h and the second hole 140h may be located inwardly of the third hole 160h in a plan view.

The third hole 160h of the bank layer 160 may not cover the anode overhang structure 151 of the auxiliary electrode area and may expose the anode overhang structure 151 therethrough to the outside.

In an area where each of the pair of undercuts 130u is not formed, a passivation step 130s, an overcoat step 140s, and a bank step 160s may be sequentially stacked.

For example, on the passivation layer 130 including the passivation step 130s, the overcoat layer 140 exposing the passivation step 130s therethrough and including the overcoat step 140s may be disposed. On the overcoat layer 140 including the overcoat step 140s, the bank layer 160 exposing the overcoat step 140s therethrough and including the bank steps 160s may be disposed.

The passivation step 130s, the overcoat step 140s, and the bank step 160s may be sequentially stacked in this order above the auxiliary electrode 226.

That is, a spacing between the passivation step 130s and the auxiliary electrode 226 may be the smallest, and a spacing between the bank step 160s and the auxiliary electrode 226 may be the largest.

Further, the bank step 160s, the overcoat step 140s, and the passivation step 130s may have a tapered shape in which a horizontal dimension at a top face thereof is smaller than a horizontal dimension at a bottom face thereof, and thus may be stacked in a stepped manner.

The organic light-emitting layer 170 may be formed on the bank layer 160, and the cathode electrode 180 may be formed on the organic light-emitting layer 170.

A portion of the auxiliary electrode 226 exposed through the first hole 130h may act as an auxiliary electrode contact 226c.

The organic light-emitting layer 170 and the cathode electrode 180 may be formed on the auxiliary electrode contact 226c and may contact the auxiliary electrode contact 226c and each other.

The auxiliary electrode 226 may be electrically connected to a low-potential power line VSSL extending across the display area DA.

For example, the auxiliary electrode 226 may be formed integrally with the low-potential power line VSSL, and the auxiliary electrode 226 may be formed to protrude from the low-potential power line VSSL toward a light-transmissive area TA.

The low-potential power line VSSL may be disposed to overlap the bank layer 160 and not to overlap with the light-emitting area EA and the light-transmissive area TA, and may be electrically connected to the light-emitting area EA so as to supply low-potential power VSS thereto.

As described above, the low-potential power line VSSL does not overlap the light-emitting area EA and the light-transmissive area TA, but overlaps the bank layer 160, such that loss of the light-emitting area and the transmissive area due to the low-potential power line VSSL may be reduced.

According to an embodiment of the present disclosure, in order to electrically connect the auxiliary electrode 226 and the cathode electrode 180 to each other at the auxiliary electrode contact 226c, different deposition characteristics of the organic light-emitting layer 170 and the cathode electrode 180, and the anode overhang structure 151 having the overhang structure may be used.

The organic light-emitting layer 170 and the cathode electrode 180 may be formed using a deposition process. In this regard, the organic light-emitting layer 170 and the cathode electrode 180 may be formed to extend along the bank step 160s, the overcoat step 140s, and the passivation step 130s and then may be formed on the auxiliary electrode contact 226c.

Since the organic light-emitting layer 170 has strong straightness during deposition thereof, an invasion distance thereof into the undercut 130u under the anode overhang structure 151 may be small. However, the cathode electrode 180 does not have strong straightness during deposition thereof, such that an invasion distance thereof into the undercut 130u under the anode overhang structure 151 may be large.

Accordingly, the cathode electrode 180 may be present in the undercut 130u and may directly contact the auxiliary electrode contact 226c, so that the cathode electrode 180 may be electrically connected to the auxiliary electrode 226.

Since the anode overhang structure 151 is spaced apart from the auxiliary electrode 226 lying thereunder by a predetermined distance (or, in some embodiments, any selected distance), the organic light-emitting layer 170 and the cathode electrode 180 formed on the anode overhang structure 151 may not extend to the auxiliary electrode contact 226c and thus the organic light-emitting layer 170 and the cathode electrode 180 formed on the anode overhang structure 151 may terminate on the anode overhang structure 151.

As described above, according to an embodiment of the present disclosure, the cathode electrode 180 may be brought into contact with the auxiliary electrode 226 via the undercut defined below the overhang structure, based on the difference between the deposition characteristics of the organic light-emitting layer 170 and the cathode electrode 180, thereby reducing the electrical resistance of the cathode electrode 180.

Accordingly, according to an embodiment of the present disclosure, occurrence of the low-potential power rise may be reduced by reducing the electrical resistance of the cathode electrode 180, such that the occurrence of the luminance non-uniformity of the display device may be reduced.

Further, according to an embodiment of the present disclosure, when the overhang structure for contacting the cathode electrode 180 and the auxiliary electrode 226 with each other is formed, the first hole 130h of the passivation layer 130 includes the pair of undercuts 130u having a symmetrical structure with each other and respectively disposed at opposing sides of the first middle area 130c. Thus, possibility of occurrence of defects according to a movement direction of the substrate in a process of forming the organic light-emitting layer 170 may be reduced.

FIG. 4 is a diagram of comparison between a normal case and a defective case in terms of contact between an auxiliary electrode and a cathode electrode according to a transfer direction of a substrate of a display device. Referring to FIG.

4, in a configuration in which the passivation layer 130 is disposed on the auxiliary electrode 226, and the anode electrode 150 including the anode overhang structure 151 is disposed on the passivation layer 130 such that the undercut 130u is defined below the anode overhang structure 151, each of normal and defective contacts between the auxiliary electrode 226 and the cathode electrode 180 according to transfer of the substrate during the deposition process of the organic light-emitting element are compared to each other.

When the organic light-emitting layer 170 is formed on the anode electrode 150 including the anode overhang structure 151, the organic light-emitting layer 170 may be formed using a process of depositing an organic light-emitting material while transferring the substrate in one direction.

In this case, since the substrate moves in one direction, a deposition direction of the organic light-emitting element may be influenced by the movement direction of the substrate, and thus the organic light-emitting element may be deposited in an oblique direction.

For example, as shown in the normal case of FIG. 4, when an inlet of the undercut 130u faces in the transfer direction of the substrate, the undercut 130u may be screened with the anode overhang structure 151 against the deposition of the organic light-emitting element.

Accordingly, in the normal case, deep deposition of the organic light-emitting element into the undercut 130u may be prevented due to the anode overhang structure 151 positioned on the undercut 130u.

Therefore, when the cathode electrode 180 is deposited after the organic light-emitting layer 170 has been deposited, the cathode electrode 180 may be deposited more deeply into the undercut 130u than the organic light-emitting layer 170, in the normal case. Thus, the cathode electrode 180 may normally contact the auxiliary electrode 226.

On the contrary, as shown in the defective case in FIG. 4, when an inlet of the undercut 130u faces in a direction opposite to the transfer direction of the substrate, the undercut 130u may be not screened with the anode overhang structure 151 against the deposition of the organic light-emitting element.

Accordingly, in the defective case, the deep deposition of the organic light-emitting element into the undercut 130u may not be prevented due to the anode overhang structure 151 located on the undercut 130u.

Further, in the defective case, the deposition direction of the organic light-emitting element according to the movement direction of the substrate becomes the diagonal direction in which the deep deposition of the organic light-emitting element into the undercut 130u may be easily achieved. Thus, the organic light-emitting layer 170 may be formed deeply into the undercut 130u.

Therefore, when the cathode electrode 180 is deposited after the organic light-emitting layer 170 has been deposited, a contact area by which the cathode electrode 180 and the auxiliary electrode 226 contact each other in the undercut 130u may be reduced due to the organic light-emitting layer 170. This may lead to poor contact.

Therefore, according to an embodiment of the present disclosure, when the overhang structure for contacting the cathode electrode 180 and the auxiliary electrode 226 with each other is formed, the first hole 130h of the passivation layer 130 includes the pair of undercuts 130u having a symmetrical structure with each other and respectively disposed at opposing sides of the first middle area 130c. Thus, even when the contact in one undercut 130u is defective depending on the movement direction of the substrate, the contact in the other undercut 130u may be normal.

Thus, the pair of undercuts 130u may be arranged along the movement direction of the substrate in the process of forming the organic light-emitting layer 170.

Accordingly, the process of forming the organic light-emitting layer 170 may not be affected by the movement direction of the substrate, and thus the possibility that the poor contact between the cathode electrode 180 and the auxiliary electrode 226 may occur in the undercut 130u may be reduced.

In reference to FIG. 4, it is shown that the organic light-emitting layer 170 contacts a top surface 150T of the anode overhang structure 151 but does not contact a side surface 151S of the anode overhang structure 151. The cathode electrode 180 includes a side surface 180S and the side surface 180S of the cathode electrode 180 contacts the side surface 151S of the anode overhang structure 151. Here, the cathode electrode 180 does not contact the top surface 150T of the anode overhang structure 151.

Further, according to an embodiment of the present disclosure, in a plan view of the display device, the first hole 130h of the passivation layer 130, the second hole 140h of the overcoat layer 140, and the third hole 160h of the bank layer 160 are located within an area corresponding to the auxiliary electrode 226 having a planarized surface. Thus, the undercut 130u may also be located on the planarized surface of the auxiliary electrode 226, such that a curvature of the undercut 130u may be reduced and thus the cathode electrode 180 may contact the auxiliary electrode 226 in a continuous manner. In this connection, the term "curvature of the undercut 130u" may refer to a curvature of the top surface of the auxiliary electrode 226 in a region corresponding to the undercut 130u, for example, referring to FIG. 3B, to the curvature of the top surface of the auxiliary electrode 226 in the region that is overlapped by the anode electrode 150.

Hereinafter, a display device according to another embodiment of the present disclosure will be described with reference to FIG. 5 and FIG. 6A to FIG. 6C.

Figure 5:
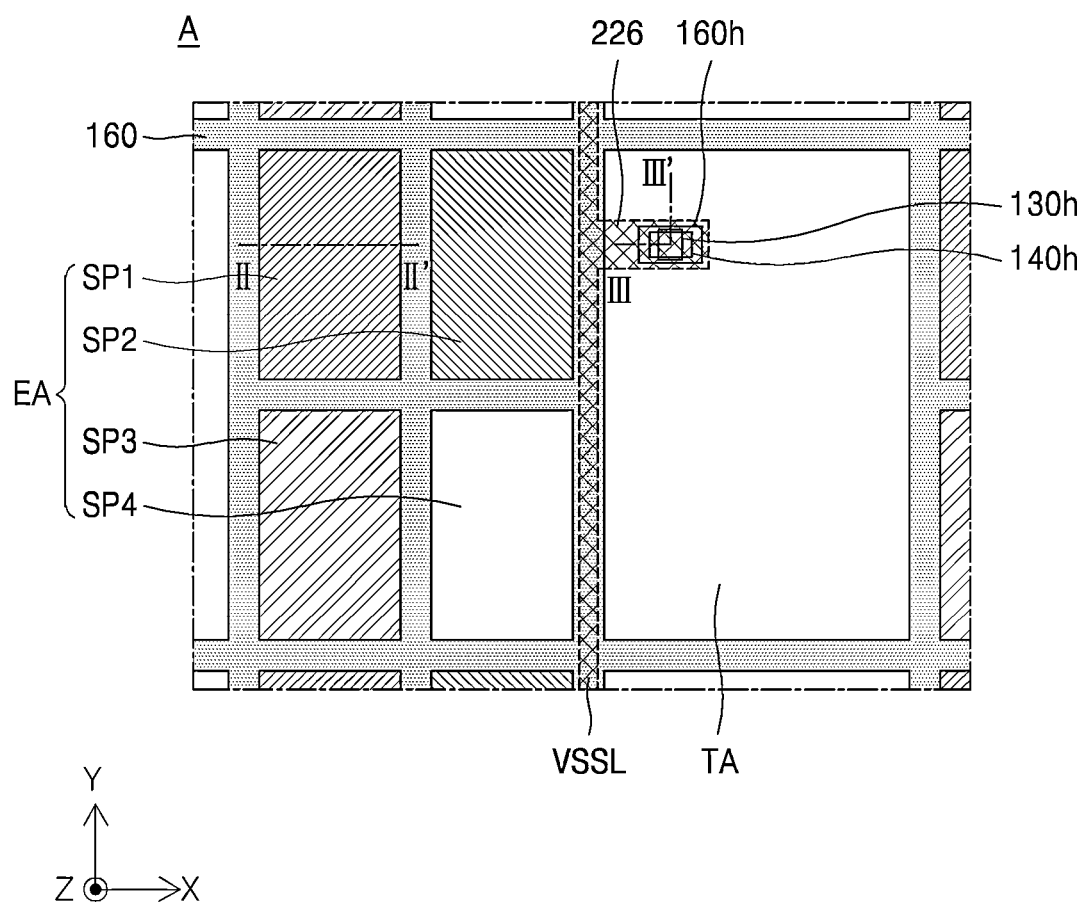
FIG. 5 is an enlarged plan view of a display device including a light-emitting area and a light-transmissive area according to another embodiment of the present disclosure.

FIG. 5 is an enlarged plan view of a display device including a light-emitting area and a light-transmissive area according to another embodiment of the present disclosure.

Figure 6A:
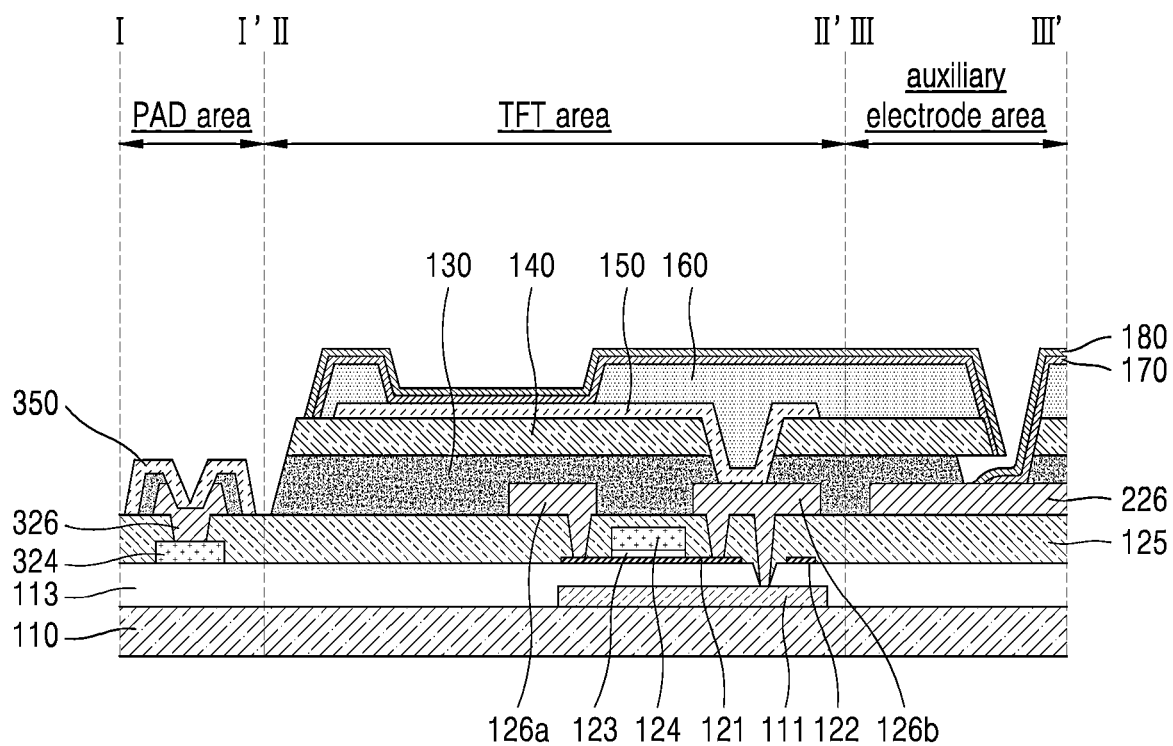
FIG. 6A is a cross-sectional view corresponding to a partial area of a display device according to another embodiment of the present disclosure.
Figure 6B:
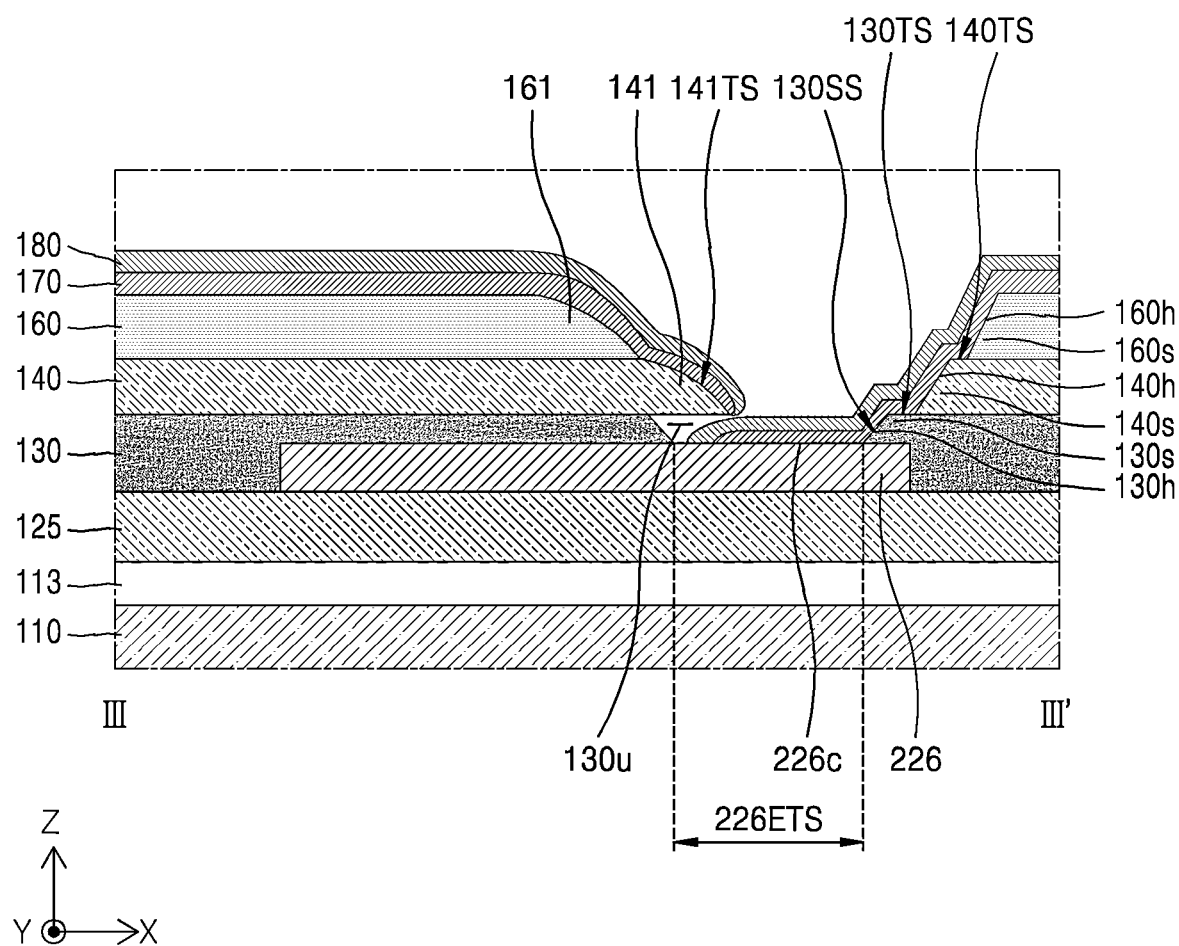
FIG. 6B is an enlarged cross-sectional view of an area corresponding to an auxiliary electrode area.
Figure 6C:
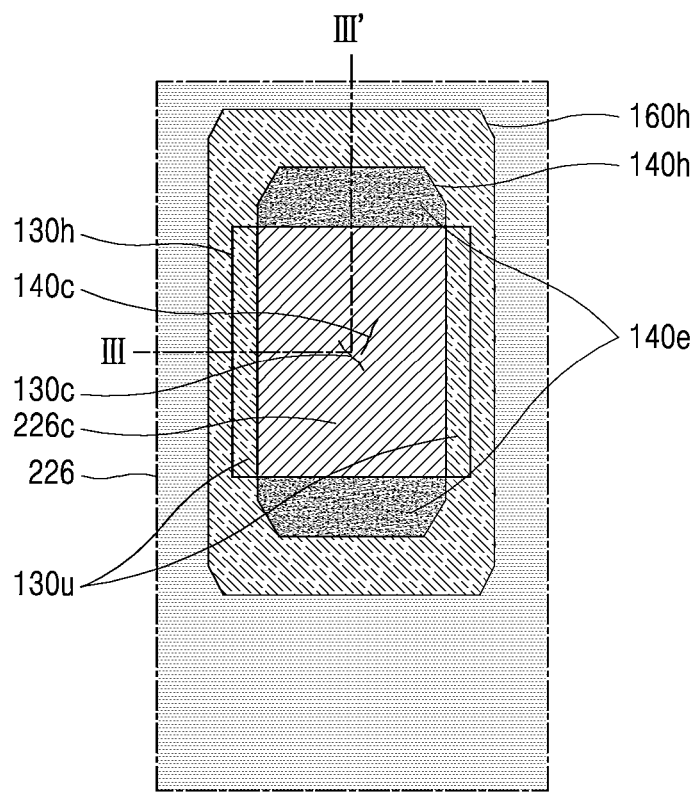
FIG. 6C is an enlarged plan view of the area corresponding to the auxiliary electrode area.
Figure 6C:
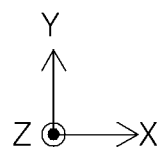

FIG. 6A is a cross-sectional view corresponding to a partial area of a display device according to another embodiment of the present disclosure. Specifically, FIG. 6A is a cross-sectional view along line I-I' of FIG. 1, and lines II-IF and III-III' of FIG. 5. FIG. 6B is an enlarged cross-sectional view of an area corresponding to an auxiliary electrode area. Specifically, FIG. 6B is an enlarged view of the cross-sectional view III-III' of FIG. 6A. FIG. 6C is an enlarged plan view of the area corresponding to the auxiliary electrode area.

In this regard, those duplicate with the descriptions of the display device according to the embodiment of the present disclosure as described above with reference to FIG. 2 and FIG. 3A to FIG. 3C may be omitted. Rather, following description is based on differences therebetween. The omitted descriptions may be equally applied to other embodiments of the present disclosure.

Therefore, the pad area PAD area and the thin-film transistor area TFT area will not be additionally described, but the auxiliary electrode area will be described in detail.

The display device 1 according to an embodiment of the present disclosure may include the substrate 110 and the auxiliary electrode 226 disposed on the substrate 110 and in the auxiliary electrode area.

The passivation layer 130 including the first hole 130h through which at least a portion of the auxiliary electrode 226 is exposed may be disposed on the auxiliary electrode 226.

The overcoat layer 140 including the second hole 140h through which at least a portion of the auxiliary electrode 226 is exposed may be disposed on the passivation layer 130.

The bank layer 160 including the third hole 160h through which at least a portion of the auxiliary electrode 226 is exposed may be disposed on the overcoat layer 140.

A bottom face of the overcoat layer 140 may directly contact the passivation layer 130, and a top face of the overcoat layer 140 may directly contact the bank layer 160.

The first hole 130h, the second hole 140h, and the third hole 160h may be arranged such that at least portions thereof overlap each other.

The first hole 130h and the second hole 140h may be disposed to intersect each other in the first direction and the second direction to overlap the middle area of the first hole 130h and the middle area of the second hole 140h. The first direction may be a direction that is parallel to a long extension of the auxiliary electrode 226. The second direction may be perpendicular to the first direction.

In accordance with the present disclosure, the intersecting between the first hole 130h and the second hole 140h may not mean that one of the first hole 130h and the second hole 140h surrounds an entirety of the other, but may mean that the middle area of the first hole 130h and the middle area of the second hole 140h overlap with each other, while both opposing other areas in the first direction of the first hole do not overlap the second hole and both opposing other areas in the second direction of the second hole do not overlap the first hole.

For example, the first hole 130h and the second hole 140h may intersect each other in a perpendicular manner to each other. The present disclosure is not limited thereto. The intersection therebetween may vary depending on shapes of the holes.

The first hole 130h and the second hole 140h may be surrounded with the third hole 160h in a plan view of FIG. 6C.

The auxiliary electrode 226 may include the auxiliary electrode contact 226c as a portion of the auxiliary electrode 226 which is exposed through the first hole 130h, the second hole 140h, and the third hole 160h which extend through the passivation layer 130, the overcoat layer 140, and the bank layer 160, respectively.

The organic light-emitting layer 170 and the cathode electrode 180 may extend to the auxiliary electrode contact 226c, and the overcoat layer 140 surrounding the auxiliary electrode contact 226c may include a pair of overcoat overhang structures 141.

The pair of undercuts 130u formed by partially removing the passivation layer 130 may be defined under the pair of overcoat overhang structures 141, respectively.

Therefore, the first hole 130h of the passivation layer 130 includes the first middle area 130c and the pair of undercuts 130u respectively disposed at opposing sides in the first direction of the first middle area 130c. The overcoat layer 140 is disposed to cover the pair of the undercuts 130u so that the pair of the undercuts 130u may not be exposed to the outside.

The pair of undercuts 130u may be disposed at or adjacent to the first middle area 130c so as to face each other and may be respectively disposed at positions symmetrical to each other. For example, the pair of undercuts 130u may be disposed symmetrically with respect to a center of the first middle area 130c.

Further, the pair of undercuts 130u may be formed in the same shape and may respectively have shapes symmetrical to each other.

Referring to FIG. 5, the first direction X may be a direction in which the light-emitting areas EA and the light-transmissive areas TA are alternately arranged with each other.

For example, in the first direction, one light-emitting area EA may be disposed between different adjacent light-transmissive areas TA, while one light-transmissive area TA may be disposed between different adjacent light-emitting areas EA.

Accordingly, the pair of undercuts 130u may be arranged so as to face each other along the direction in which the light-emitting areas EA and the light-transmissive areas TA are alternately arranged with each other.

The second hole 140h includes a second middle area 140c and a pair of passivation exposure areas 140e respectively disposed at opposing sides in the second direction of the second middle area 140c. The passivation exposure areas 140e may expose the passivation layer 130 therethrough.

The pair of passivation exposure areas 140e may be disposed at or adjacent to the second middle area 140c so as to face each other and may be respectively disposed at positions symmetrical to each other. For example, the pair of passivation exposure areas 140e may be disposed symmetrically with respect to a center of the second middle area 140c.

Further, the pair of passivation exposure areas 140e may have the same shape as each other and may respectively have shapes symmetrical to each other.

Referring to FIG. 5, the second direction may be a direction in which a plurality of light-emitting areas EA are consecutively arranged or a direction in which a plurality of light-transmissive areas TA are consecutively arranged.

For example, in the second direction, one light-emitting area EA may be disposed between different light-emitting areas EA, and one light-transmissive area TA may be disposed between different light-transmissive areas TA.

Accordingly, the pair of passivation exposure areas 140e may be arranged to face each other along a direction in which a plurality of light-emitting areas EA are consecutively arranged or a direction in which a plurality of light-transmissive areas TA are consecutively arranged.

The bank layer 160 may be disposed on the overcoat layer 140.

The bank layer 160 may include a bank protrusion 161, and the bank protrusion 161 may be disposed on the overcoat overhang structure 141.

The overcoat overhang structure 141 may be formed to protrude beyond the bank protrusion 161.

The organic light-emitting layer 170 may be disposed on the bank layer 160, and the cathode electrode 180 may be disposed on the organic light-emitting layer 170. The organic light-emitting layer 170 and the cathode electrode 180 may extend along at least one of (e.g., along one of; e.g., along both of) the passivation exposure areas 140e and then be disposed on the auxiliary electrode 226.

The organic light-emitting layer 170 and the cathode electrode 180 may extend along at least one of (e.g., along one of; e.g., along both of) the passivation exposure areas 140e and into at least one of (e.g., along one of; e.g., along both of) the undercuts 130u. The cathode electrode 180 positioned in at least one of (e.g., along one of; e.g., along both of) the undercuts 130u may extend beyond the organic light-emitting layer 170 and may directly contact the auxiliary electrode 226.

In an area where each of the pair of undercuts 130u is not formed, the passivation step 130s, the overcoat step 140s, and the bank step 160s may be sequentially stacked.

The passivation step 130s may correspond to the passivation exposure area 140e. Each of the passivation step 130s, the overcoat step 140s, and the bank step 160s may extend along the second direction.

For example, on the passivation layer 130 including the passivation step 130s, the overcoat layer 140 exposing the passivation step 130s therethrough and including the overcoat step 140s may be disposed. On the overcoat layer 140 including the overcoat step 140s, the bank layer 160 which exposes the overcoat step 140s therethrough and includes the bank step 160s may be disposed.

Therefore, the overcoat layer 140 surrounding the auxiliary electrode contact 226c may include the overcoat step 140s. The bank step 160s may be disposed on the overcoat step 140s such that the overcoat step 140s is partially exposed. The passivation step 130s may be disposed under the overcoat step 140s such that the auxiliary electrode contact 226c is partially exposed.

The passivation step 130s, the overcoat step 140s, and the bank step 160s may be sequentially stacked in this order above the auxiliary electrode 226.

That is, a spacing between the passivation step 130s and the auxiliary electrode 226 may be the smallest, and a spacing between the bank step 160s and the auxiliary electrode 226 may be the largest.

Further, the bank step 160s, the overcoat step 140s, and the passivation step 130s may have a tapered shape in which a horizontal dimension at a top face thereof is smaller than a horizontal dimension at a bottom face thereof, and thus may be stacked in a stepped manner.

The organic light-emitting layer 170 and the cathode electrode 180 may extend along the bank step 160s, the overcoat step 140s, and the passivation step 130s, and then may be disposed on the auxiliary electrode contact 226c.

The cathode electrode 180 disposed on the auxiliary electrode contact 226c may contact the auxiliary electrode 226 in an area corresponding to the undercut 130u.

The first hole 130h, the second hole 140h, and the third hole 160h may be located inside the auxiliary electrode 226 in the plan view.

In this case, a portion of the auxiliary electrode 226 corresponding to the first hole 130h, the second hole 140h, and the third hole 160h may have a planarized surface.

The substrate 110 may include the display area DA and the non-display area NDA. The display area DA may include the light-emitting area EA and the light-transmissive area TA. The auxiliary electrode 226 may overlap the light-transmissive area TA.

The auxiliary electrode 226 may be formed to protrude from the low-potential power line VSSL extending across the display area DA toward the light-transmissive area TA so as not to overlap the light-emitting area EA.

According to an embodiment of the present disclosure, in order to electrically connect the auxiliary electrode 226 and the cathode electrode 180 to each other at the auxiliary electrode contact 226c, different deposition characteristics of the organic light-emitting layer 170 and the cathode electrode 180, and the overcoat overhang structure 141 having the overhang structure may be used.

The organic light-emitting layer 170 and the cathode electrode 180 may be formed using a deposition process. In this regard, the organic light-emitting layer 170 and the cathode electrode 180 may be formed to extend along the bank step 160s, the overcoat step 140s, and the passivation step 130s and then may be formed on the auxiliary electrode contact 226c.

Since the organic light-emitting layer 170 has strong straightness during deposition thereof, an invasion distance thereof into the undercut 130u under the overcoat overhang structure 141 may be small. However, the cathode electrode 180 does not have strong straightness during deposition thereof, such that an invasion distance thereof into the undercut 130u under the overcoat overhang structure 141 may be large.

Accordingly, the cathode electrode 180 may be present in the undercut 130u and may directly contact the auxiliary electrode contact 226c, so that the cathode electrode 180 may be electrically connected to the auxiliary electrode 226.

Since the overcoat overhang structure 141 is spaced apart from the auxiliary electrode 226 lying thereunder by a predetermined distance (or, in some embodiments, any selected distance), the organic light-emitting layer 170 and the cathode electrode 180 formed on the overcoat overhang structure 141 may not extend to the auxiliary electrode contact 226c and thus the organic light-emitting layer 170 and the cathode electrode 180 formed on the overcoat overhang structure 141 may terminate on the overcoat overhang structure 141.

Referring to FIG. 6B, the passivation layer 130 exposes a top surface 226ETS of the auxiliary electrode 226. The overcoat layer 140 is on the passivation layer 130. The overcoat layer 140 includes the overcoat overhang structure 141 and the overcoat overhang structure 141 overlaps the exposed top surface 226ETS of the auxiliary electrode 226. A top surface 141TS of the overcoat overhang structure 141 is covered by the organic light-emitting layer 170.

As shown in the right side of FIG. 6B, the overcoat layer 140 exposes a top surface 130TS of the passivation layer 130. Similarly, the bank layer 160 exposes a top surface 140TS of the overcoat layer 140. The organic light-emitting layer 170 covers the exposed top surface 140TS of the overcoat layer 140 and the exposed top surface 130TS of the passivation layer 130 and a side surface 130SS of the passivation layer 130.

As described above, according to an embodiment of the present disclosure, the cathode electrode 180 may be brought into contact with the auxiliary electrode 226 through the overcoat overhang structure 141 based on the difference between the deposition characteristics of the organic light-emitting layer 170 and the cathode electrode 180, thereby reducing the electrical resistance of the cathode electrode 180.

Accordingly, according to an embodiment of the present disclosure, occurrence of the low-potential power rise may be reduced by reducing the electrical resistance of the cathode electrode 180, such that the occurrence of the luminance non-uniformity of the display device may be reduced.

Further, according to an embodiment of the present disclosure, when the overhang structure for contacting the cathode electrode 180 and the auxiliary electrode 226 with each other is formed, the passivation layer 130, the overcoat layer 140, and the bank layer 160 may be sequentially stacked in this order, and the overcoat layer 140 may include the pair of overcoat overhang structures 141, and the bank protrusion 161 may be disposed on the overcoat overhang structure 141.

According to an embodiment of the present disclosure, not the bank layer 160 but the overcoat layer 140 may be disposed on the passivation layer 130, thereby reducing the occurrence of tearing defects due to poor adhesion between the bank layer 160 and the passivation layer 130.

Further, the bank layer 160 is disposed on the overcoat layer 140, thereby reducing the occurrence of deformation of the overcoat layer 140 or lift-off of the overcoat overhang structure 141 due to stress.

Figure 7A:
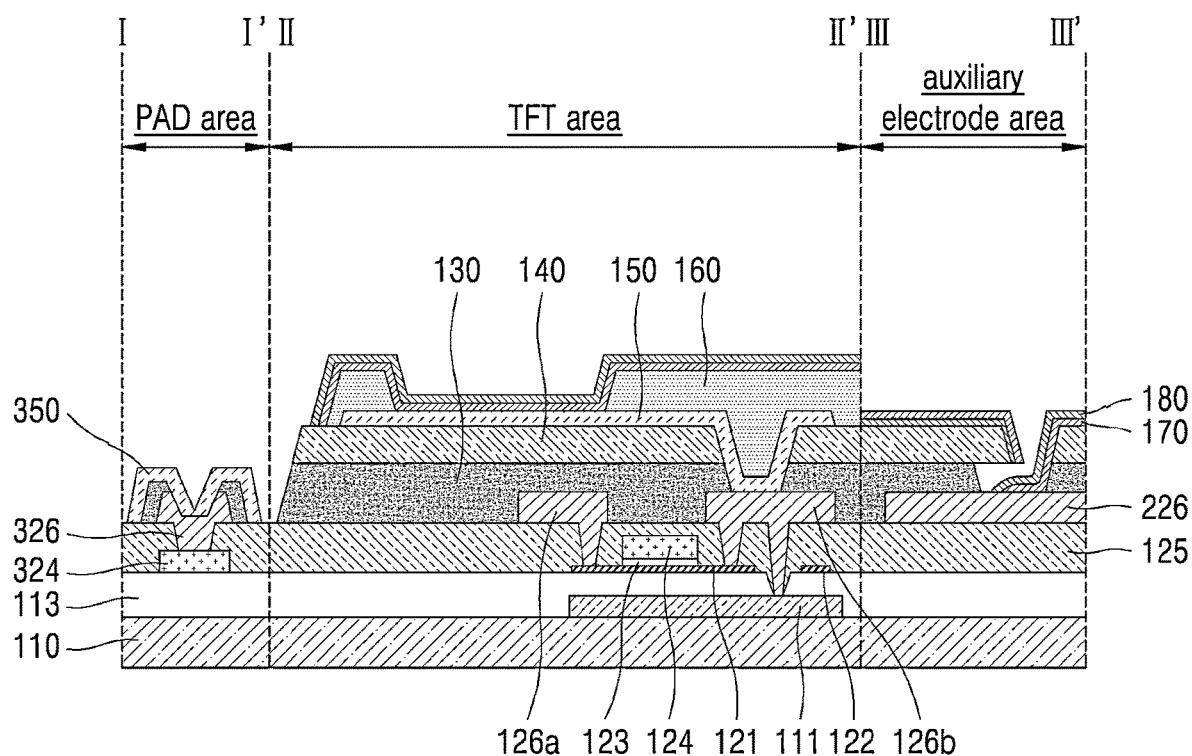
FIG. 7A is a cross-sectional view corresponding to a partial area of a display device according to another embodiment of the present disclosure.
Figure 7B:
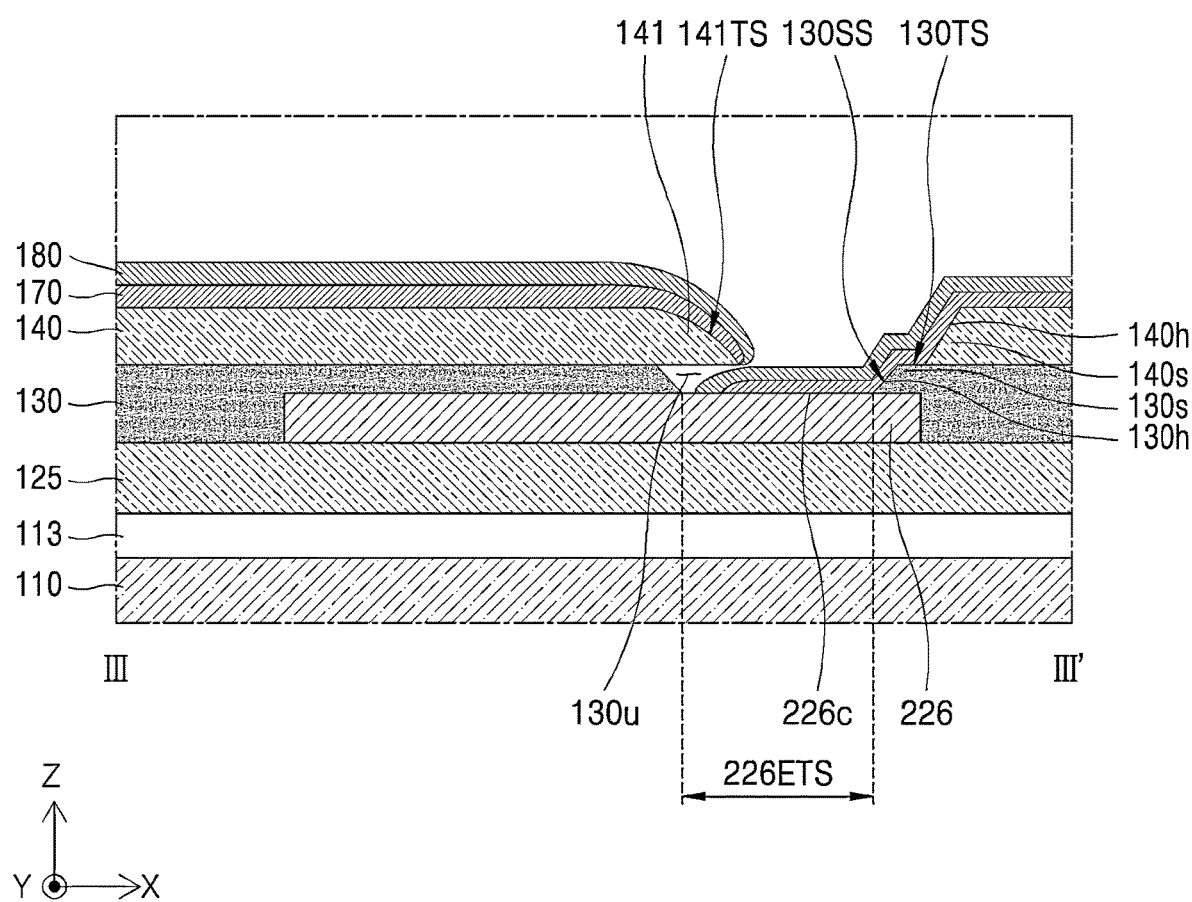
FIG. 7B is an enlarged cross-sectional view of an area corresponding to an auxiliary electrode area.
Figure 7C:
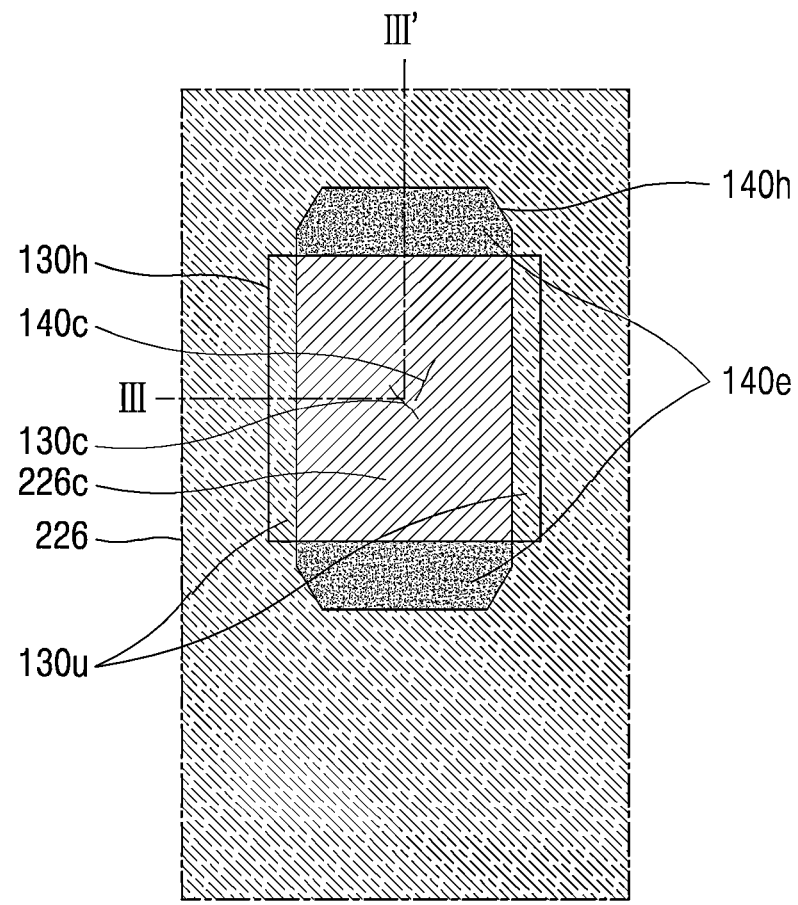
FIG. 7C is an enlarged plan view of the area corresponding to the auxiliary electrode area.

FIG. 7A is a cross-sectional view corresponding to a partial area of a display device according to another embodiment of the present disclosure. FIG. 7B is an enlarged cross-sectional view of an area corresponding to an auxiliary electrode area. FIG. 7C is an enlarged plan view of the area corresponding to the auxiliary electrode area.

In this regard, those duplicate with the descriptions of the display device according to the embodiment of the present disclosure as described above with reference to FIG. 6A to FIG. 6C may be omitted. Rather, following description is based on differences therebetween. The omitted descriptions may be equally applied to other embodiments of the present disclosure.

Therefore, the pad area PAD area and the thin-film transistor area TFT area will not be additionally described, but the auxiliary electrode area will be described in detail.

The display device 1 according to an embodiment of the present disclosure may include the substrate 110 and the auxiliary electrode 226 disposed on the substrate 110 and in the auxiliary electrode area.

The passivation layer 130 including the first hole 130h through which at least a portion of the auxiliary electrode 226 is exposed may be disposed on the auxiliary electrode 226.

The overcoat layer 140 including the second hole 140h through which at least a portion of the auxiliary electrode 226 is exposed may be disposed on the passivation layer 130.

The first hole 130h, and the second hole 140h may be arranged such that at least portions thereof overlap each other. The first hole 130h and the second hole 140h may be disposed to intersect each other in the first direction and the second direction to overlap the middle area of the first hole 130h and the middle area of the second hole 140h. The first direction may be a direction that is parallel to a long extension of the auxiliary electrode 226. The second direction may be perpendicular to the first direction.

In accordance with the present disclosure, the intersecting between the first hole 130h and the second hole 140h may not mean that one of the first hole 130h and the second hole 140h surrounds an entirety of the other, but may mean that the middle area of the first hole 130h and the middle area of the second hole 140h overlap with each other, while both opposing other areas in the first direction of the first hole 130h do not overlap the second hole 140h and both opposing other areas in the second direction of the second hole 140h do not overlap the first hole 130h.

For example, the first hole 130h and the second hole 140h may intersect each other in a perpendicular manner to each other. The present disclosure is not limited thereto. The intersection therebetween may vary depending on shapes of the holes.

The auxiliary electrode 226 may include the auxiliary electrode contact 226c as a portion of the auxiliary electrode 226 which is exposed through the first hole 130h, and the second hole 140h, which extend through the passivation layer 130, and the overcoat layer 140, respectively.

The organic light-emitting layer 170 and the cathode electrode 180 may extend to the auxiliary electrode contact 226c, and the overcoat layer 140 surrounding the auxiliary electrode contact 226c may include a pair of overcoat overhang structures 141.

A pair of undercuts 130u formed by partially removing the passivation layer 130 may be defined under the pair of overcoat overhang structures 141, respectively.

Therefore, the first hole 130h of the passivation layer 130 includes the first middle area 130c and the pair of undercuts 130u respectively disposed at opposing sides in the first direction of the first middle area 130c. The overcoat layer 140 is disposed to cover the pair of undercuts 130u so that the pair of undercuts 130u may not be exposed to the outside.

The pair of undercuts 130u may be disposed at or adjacent to the first middle area 130c so as to face each other and may be respectively disposed at positions symmetrical to each other. For example, the pair of undercuts 130u may be disposed symmetrically with respect to a center of the first middle area 130c.

Further, the pair of undercuts 130u may be formed in the same shape and may respectively have shapes symmetrical to each other.

For example, in the first direction, one light-emitting area EA may be disposed between different adjacent light-transmissive areas TA, while one light-transmissive area TA may be disposed between different adjacent light-emitting areas EA.

Accordingly, the pair of undercuts 130u may be arranged so as to face each other along the direction in which the light-emitting areas EA and the light-transmissive areas TA are alternately arranged with each other.

The second hole 140h may include a second middle area 140c and a pair of passivation exposure areas 140e respectively disposed at opposing sides in the second direction of the second middle area 140c. The passivation exposure areas 140e may expose the passivation layer 130 therethrough.

The pair of passivation exposure areas 140e may be disposed at or adjacent to the second middle area 140c so as to face each other and may be respectively disposed at positions symmetrical to each other. For example, the pair of passivation exposure areas 140e may be disposed symmetrically with respect to a center of the second middle area 140c.

Further, the pair of passivation exposure areas 140e may have the same shape as each other and may respectively have shapes symmetrical to each other.

For example, in the second direction, one light-emitting area EA may be disposed between different adjacent light-emitting areas EA, and one light-transmissive area TA may be disposed between different adjacent light-transmissive areas TA.

Accordingly, the pair of passivation exposure areas 140e may be arranged to face each other along a direction in which a plurality of light-emitting areas EA are consecutively arranged or a direction in which a plurality of light-transmissive areas TA are consecutively arranged.

The organic light-emitting layer 170 may be disposed on the overcoat layer 140, and the cathode electrode 180 may be disposed on the organic light-emitting layer 170. A bottom face of the organic light-emitting layer 170 may directly contact the overcoat layer 140. The organic light-emitting layer 170 and the cathode electrode 180 may extend along at least one of (e.g., along one of; e.g., along both of) the passivation exposure areas 140e and may be disposed on the auxiliary electrode 226.

Figure 8A:
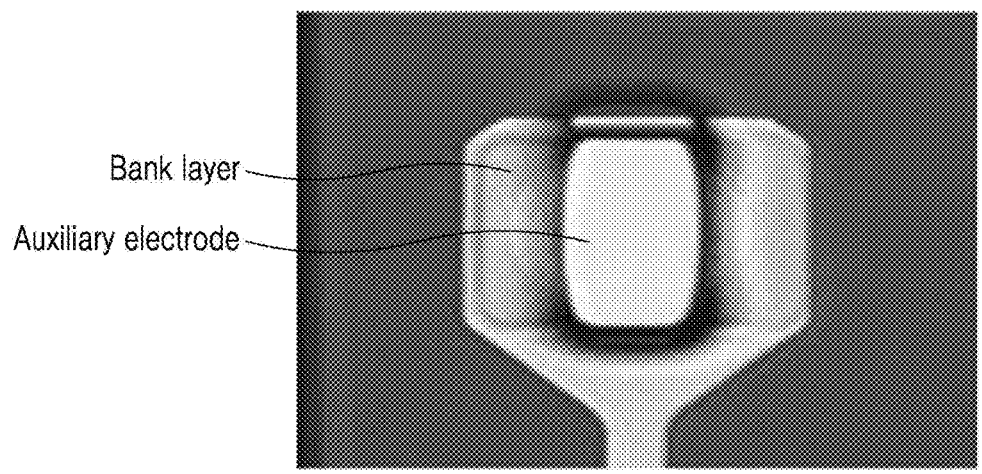
FIG. 8A and FIG. 8B are respectively diagrams of a normal case in which an overhang structure of a bank layer is not torn, and a defective case in which the overhang structure of the bank layer is torn.

FIG. 8A shows an example of a normal case in which the auxiliary electrode is exposed due to the overhang structure of the bank layer.

For example, in the normal case, when the bank layer is formed to be in direct contact with the passivation layer, and an overhang structure is formed from the bank layer, the overhang structure is not torn.

Figure 8B:
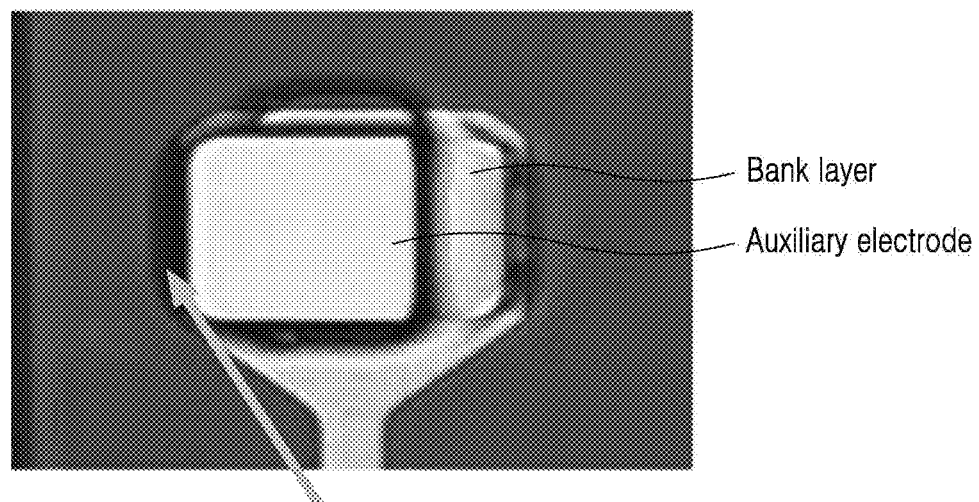

FIG. 8B shows an example of a defective case where the auxiliary electrode is exposed due to the overhang structure of the bank layer.

For example, in the defective case, when the bank layer is formed to be in direct contact with the passivation layer, and an overhang structure is formed from the bank layer, the overhang structure is torn.

In the defective case, when the bank layer is formed to be in direct contact with the passivation layer, and an overhang structure is formed from the bank layer, the tearing of the overhang structure may occur due to poor adhesion between the passivation layer and the bank layer.

However, according to an embodiment of the present disclosure, the overcoat layer having excellent adhesion to the passivation layer is formed on the passivation layer so as to be in direct contact with the passivation layer. Further, the overhang structure is formed from the overcoat layer. Thus, the tearing of the overhang structure may be reduced.

Figure 9A:
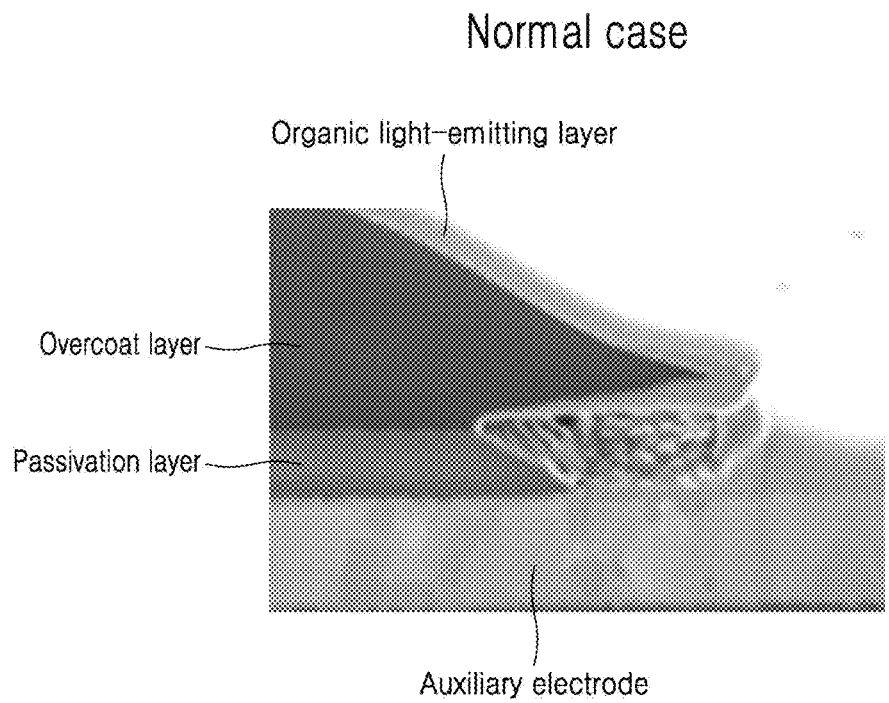
FIG. 9A and FIG. 9B are respectively diagrams of a normal case in which a lift-off of an overhang structure of an overcoat layer does not occur and a defective case in which the lift-off of the overhang structure of the overcoat layer occurs.
Figure 9B:
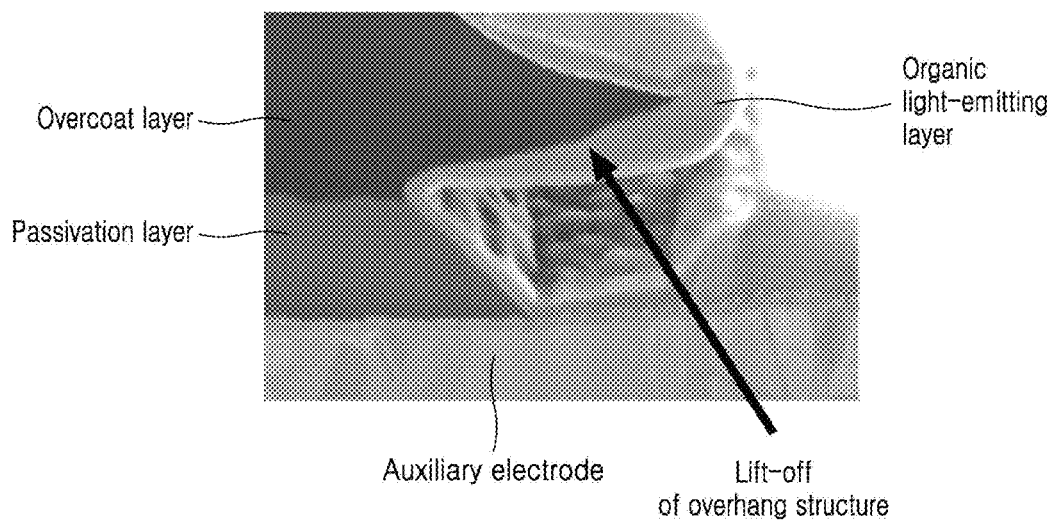

In one example, FIG. 9A shows an example of a normal case in which the auxiliary electrode is exposed due to the overhang structure of the overcoat layer.

For example, in the normal case, when the overcoat layer is formed to directly contact the passivation layer, the organic light emitting layer is formed on the overcoat layer, and the overhang structure is formed from the overcoat layer, the lift-off of the overhang structure does not occur.

FIG. 8B shows an example of a defective case where the auxiliary electrode is exposed due to the overhang structure of the overcoat layer.

For example, in the defective case, when the overcoat layer is formed to directly contact the passivation layer, the organic light emitting layer is formed on the overcoat layer, and the overhang structure is formed from the overcoat layer, the lift-off of the overhang structure occurs.

When the overhang structure is composed only of the overcoat layer, the overcoat layer may be deformed due to stress or the overhang structure of the overcoat layer may be lifted off due to the stress.

However, according to an embodiment of the present disclosure, the bank layer is formed to be in contact with the overcoat layer, and the bank protrusion is formed on the overcoat overhang structure, such that the overcoat layer may not be deformed due to the stress or the occurrence of the lift-off of the overcoat overhang structure may be reduced.

That is, the overcoat layer has improved adhesion to the passivation layer, and the bank layer serves to suppress the deformation of the overcoat layer. Thus, a double-layer structure of the overcoat layer and the bank layer may have advantages of both the overcoat layer and the bank layer while one of the overcoat layer and the bank layer compensate for a disadvantage of the other thereof, compared to a case in which only the overcoat layer or the bank layer is formed alone on the passivation layer.

Further, according to an embodiment of the present disclosure, when the overhang structure for contacting the cathode electrode 180 and the auxiliary electrode 226 with each other is formed, the overhang structure is composed of the overcoat layer 140 as an insulating layer instead of a conductive pixel electrode, and the bank layer 160 is formed on the overcoat layer 140. Thus, a thickness of the overhang structure may be substantially increased, thereby achieving a robust structure on which a cleaning process is easily performed.

For example, when the overhang structure is composed of the anode electrode as a pixel electrode having a relatively smaller thickness, the overhang structure may be damaged due to a cleaning process. On the contrary, according to an embodiment of the present disclosure, the overhang structure may be composed of the overcoat layer 140 and the bank layer 160, thereby increasing the thickness of the overhang structure such that a more robust structure may be formed.

Further, according to an embodiment of the present disclosure, when the overhang structure for contacting the cathode electrode 180 and the auxiliary electrode 226 with each other is formed, the overhang structure is composed of the overcoat layer 140 made of a non-conductive material instead of a conductive pixel electrode, and the bank layer 160 is formed on the overcoat layer 140. Thus, the occurrence of static electricity defects that may occur in the area may be reduced.

Further, according to an embodiment of the present disclosure, when the overhang structure for contacting the cathode electrode 180 and the auxiliary electrode 226 with each other is formed, the first hole 130h of the passivation layer 130 includes the pair of undercuts 130u disposed respectively at opposing sides of the first middle area 130c and positioned in a symmetrical manner to each other. Thus, the possibility of occurrence of defects according to the movement direction of the substrate in the process of forming the organic light-emitting layer 170 may be reduced.

When the organic light-emitting layer 170 is formed on the overhang structure, the organic light-emitting layer 170 may be formed by depositing an organic light-emitting material during the process of transferring the substrate.

Since the substrate moves in one direction, the deposition direction of the organic light-emitting element may be influenced by the movement direction of the substrate and thus may be an oblique direction.

In this case, when an inlet of the undercut 130u faces in the transfer direction of the substrate, the undercut 130u may be screened with the overcoat overhang structure 141 against the deposition of the organic light-emitting element.

Accordingly, deep deposition of the organic light-emitting element into the undercut 130u may be prevented due to the overcoat overhang structure 141 positioned on the undercut 130u.

Therefore, when the cathode electrode 180 is deposited after the organic light-emitting layer 170 has been deposited, the cathode electrode 180 may be deposited more deeply into the undercut 130u than the organic light-emitting layer 170. Thus, the cathode electrode 180 may normally contact the auxiliary electrode 226.

However, the transfer direction of the substrate may be changed depending on the process. Thus, in order to facilitate the contact between the cathode electrode 180 and the auxiliary electrode 226 in the undercut 130u regardless of the transfer direction of the substrate, the pair of the undercuts 130u may be disposed respectively at opposing sides of the middle area, and may be positioned at symmetrical positions to each other and may face each other, and may have the same shape.

Accordingly, according to an embodiment of the present disclosure, the influence of the directionality of the process upon the deposition of the organic light-emitting layer 170 may be reduced. Thus, the process of forming the organic light-emitting layer 170 may be not affected by the movement direction of the substrate, and the possibility of poor contact between the cathode electrode 180 and the auxiliary electrode 226 in the undercut 130u may be reduced.

For example, when the overhang structure for contacting the cathode electrode 180 and the auxiliary electrode 226 with each other is formed, the first hole 130h of the passivation layer 130 includes the pair of undercuts 130u disposed respectively at opposing sides of the first middle area 130c and positioned in a symmetrical manner to each other. Thus, even when a defective contact occurs in one undercut 130u according to the movement direction of the substrate, a normal contact may occur in the other undercut 130u.

Thus, the pair of undercuts 130u may be arranged along the movement direction of the substrate in the process of forming the organic light-emitting layer 170.

Accordingly, the process of forming the organic light-emitting layer 170 is not affected by the movement direction of the substrate, and the possibility that the poor contact between the cathode electrode 180 and the auxiliary electrode 226 may occur in the undercut 130u may be reduced.

Further, according to an embodiment of the present disclosure, in a plan view of the display device, the first hole 130h of the passivation layer 130, the second hole 140h of the overcoat layer 140, and the third hole 160h of the bank layer 160 may be located within an area corresponding to the auxiliary electrode 226 having a planarized surface. Thus, the undercut 130u may also be located on the planarized surface of the auxiliary electrode 226, such that a curvature of the undercut 130u may be reduced and thus the cathode electrode 180 may contact the auxiliary electrode 226 in a continuous manner.

For example, in a plan view of the display device, the first hole 130h of the passivation layer 130, the second hole 140h of the overcoat layer 140, and the third hole 160h of the bank layer 160 may be located within an area corresponding to the auxiliary electrode 226. Thus, the bank step 160s, the overcoat step 140s, and the passivation step 130s having a tapered shape in which a horizontal dimension at a top face thereof is smaller than a horizontal dimension at a bottom face thereof may be easily formed. Thus, the cathode electrode 180 may contact the auxiliary electrode 226 in a continuous manner.

A display device according to an embodiment of the present disclosure may be described as follows.

A first aspect of the present disclosure provides a display device comprising: a substrate: an auxiliary electrode disposed on the substrate; a passivation layer disposed on the auxiliary electrode and having a first hole defined therein through which at least a portion of the auxiliary electrode is exposed; an overcoat layer disposed on the passivation layer and having a second hole defined therein through which the at least a portion of the auxiliary electrode is exposed; and a bank layer disposed on the overcoat layer and having a third hole defined therein through which the at least a portion of the auxiliary electrode is exposed, wherein the first hole, the second hole, and the third hole are arranged such that at least portions thereof overlap each other in a plan view of the display device, wherein a middle area in a first direction of the first hole overlaps a middle area in a second direction of the second hole, wherein the first direction intersects the second direction.

In one implementation of the first aspect, the first hole includes: a first middle area in the first direction thereof; and a pair of undercuts respectively disposed at both opposing sides in the first direction of the first middle area, wherein the overcoat layer is disposed to cover the pair of undercuts so that the pair of undercuts are not exposed to an outside.

In one implementation of the first aspect, the pair of undercuts are arranged in a symmetrical manner with each other around the first middle area.

In one implementation of the first aspect, the second hole includes: a second middle area in the second direction thereof; and a pair of passivation exposure areas respectively disposed at both opposing sides in the second direction of the second middle area, wherein the passivation exposure areas expose the passivation layer therethrough.

In one implementation of the first aspect, the pair of passivation exposure areas are arranged in a symmetrical manner with each other around the second middle area.

In one implementation of the first aspect, the device further comprises: an organic light-emitting layer disposed on the bank layer; and a cathode electrode disposed on the organic light-emitting layer, wherein the organic light-emitting layer and the cathode electrode extend along the passivation exposure area and then are disposed on the auxiliary electrode.

In one implementation of the first aspect, the organic light-emitting layer and the cathode electrode extend along the passivation exposure area and into the undercut, wherein a portion of the cathode electrode located in the undercut extends beyond the organic light-emitting layer and thus directly contacts the auxiliary electrode.

In one implementation of the first aspect, the first hole, the second hole, and the third hole are located inside an area corresponding to the auxiliary electrode in the plan view of the display device.

In one implementation of the first aspect, a portion of the auxiliary electrode corresponding to the first hole, the second hole, and the third hole in the plan view of the display device has a planarized face.

In one implementation of the first aspect, each of the first hole and the second hole is located inside an area corresponding to the third hole in the plan view of the display device.

In one implementation of the first aspect, the substrate includes a display area and a non-display area, wherein the display area includes a light-emitting area and a light-transmissive area, wherein the auxiliary electrode overlaps the light-transmissive area in the plan view of the display device.

In one implementation of the first aspect, the device further comprises a low-potential power line extending across the display area so as not to overlap the light-emitting area, wherein the auxiliary electrode protrudes from the low-potential power line toward the light-transmissive area.

In one implementation of the first aspect, the substrate includes light-emitting areas and light-transmissive areas, wherein the light-emitting areas and the light-transmissive areas are alternately arranged in the first direction, wherein the pair of undercuts face each other along the first direction.

In one implementation of the first aspect, the substrate includes a plurality of light-emitting areas and a plurality of light-transmissive areas, wherein the plurality of light-emitting areas are consecutively arranged in the second direction, wherein the plurality of light-transmissive areas are consecutively arranged in the second direction, wherein the pair of passivation exposure areas face each other along the second direction.

A second aspect of the present disclosure provides a display device comprising: a substrate; an auxiliary electrode disposed on the substrate; a passivation layer disposed on the auxiliary electrode; an overcoat layer disposed on the passivation layer; a bank layer disposed on the overcoat layer; an organic light-emitting layer disposed on the bank layer; and a cathode electrode disposed on the organic light-emitting layer, wherein the auxiliary electrode includes an auxiliary electrode contact, wherein at least a portion of the auxiliary electrode contact is exposed through holes respectively extending through the passivation layer, the overcoat layer, and the bank layer, wherein the organic light-emitting layer and the cathode electrode extend to the auxiliary electrode contact, wherein a portion of the overcoat layer surrounding the auxiliary electrode contact includes a pair of overcoat overhang structures.

In one implementation of the second aspect, a pair of undercuts are respectively defined below the pair of overcoat overhang structures, wherein the pair of undercuts are formed by partially removing the passivation layer.

In one implementation of the second aspect, the pair of undercuts are arranged to face each other.

In one implementation of the second aspect, a bank protrusion from the bank layer is disposed on each of the overcoat overhang structures, wherein the overcoat overhang structure protrudes beyond the bank protrusion.

In one implementation of the second aspect, a portion of the overcoat layer surrounding the auxiliary electrode contact includes an overcoat step, wherein a bank step is disposed on the overcoat step such that the overcoat layer is partially exposed, wherein a passivation step is disposed under the overcoat step such that the passivation layer is partially exposed, wherein the organic light-emitting layer and the cathode electrode extend along and on the bank step, the overcoat step, and the passivation step and then are disposed on the auxiliary electrode contact.

In one implementation of the second aspect, each of the bank step, the overcoat step, and the passivation step has a taper shape in which a horizontal dimension at a top face thereof is smaller than a horizontal dimension at a bottom face thereof.

In one implementation of the second aspect, the bank step, the overcoat step, and the passivation step are sequentially stacked such that a first spacing between the bank step and the auxiliary electrode is larger than a second spacing between the overcoat step and the auxiliary electrode, and the second spacing is larger than a third spacing between the passivation step and the auxiliary electrode.

In one implementation of the second aspect, a portion of the cathode electrode disposed on the auxiliary electrode contact is in contact with the auxiliary electrode in an area corresponding to the undercut.

In one implementation of the second aspect, a bottom face of the overcoat layer is in direct contact with the passivation layer, wherein a top face of the overcoat layer is in direct contact with the bank layer.

A scope of protection of the present disclosure should be construed by the scope of the claims, and all technical ideas within the scope equivalent thereto should be construed as being included in the scope of the present disclosure. Although the embodiments of the present disclosure have been described in more detail with reference to the accompanying drawings, the present disclosure is not necessarily limited to these embodiments. The present disclosure may be implemented in various modified manners within the scope not departing from the technical idea of the present disclosure. Accordingly, the embodiments disclosed in the present disclosure are not intended to limit the technical idea of the present disclosure, but to describe the present disclosure. The scope of the technical idea of the present disclosure is not limited by the embodiments. Therefore, it should be understood that the embodiments as described above are illustrative and non-limiting in all respects. The scope of protection of the present disclosure should be interpreted by the claims, and all technical ideas within the scope of the present disclosure should be interpreted as being included in the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device comprising:
a substrate;
an auxiliary electrode disposed on the substrate;
a passivation layer disposed on the auxiliary electrode and having a first hole defined therein through which at least a portion of the auxiliary electrode is exposed;
an overcoat layer disposed on the passivation layer and having a second hole defined therein through which the at least a portion of the auxiliary electrode is exposed; and
a bank layer disposed on the overcoat layer and having a third hole defined therein through which the at least a portion of the auxiliary electrode is exposed,
wherein the first hole, the second hole, and the third hole are arranged such that at least portions thereof overlap each other,
wherein a middle area in a first direction of the first hole overlaps a middle area in a second direction of the second hole, wherein the first direction intersects the second direction.

2. The display device of claim 1, wherein the first hole includes:
a first middle area; and
a pair of undercuts respectively disposed at both opposing sides in the first direction of the first middle area,
wherein the overcoat layer is disposed to cover the pair of undercuts and the pair of undercuts are not exposed to an outside.

3. The display device of claim 2, wherein the pair of undercuts are arranged in a symmetrical manner with each other around the first middle area.

4. The display device of claim 2, wherein the second hole includes:
a second middle area; and
a pair of passivation exposure areas respectively disposed at both opposing sides in the second direction of the second middle area,
wherein the passivation exposure areas expose the passivation layer therethrough.

5. The display device of claim 4, wherein the pair of passivation exposure areas are arranged in a symmetrical manner with each other around the second middle area.

6. The display device of claim 4, wherein the display device further comprises:
an organic light-emitting layer disposed on the bank layer; and
a cathode electrode disposed on the organic light-emitting layer,
wherein the organic light-emitting layer and the cathode electrode extend along at least one of the passivation exposure areas and then are disposed on the auxiliary electrode.

7. The display device of claim 6, wherein the organic light-emitting layer and the cathode electrode extend into at least one of the undercuts,
wherein a portion of the cathode electrode located in the at least one of the undercuts extends beyond the organic light-emitting layer and directly contacts the auxiliary electrode.

8. The display device of claim 1, wherein the first hole, the second hole, and the third hole are located inside an area corresponding to the auxiliary electrode.

9. The display device of claim 1, wherein a portion of the auxiliary electrode corresponding to the first hole, the second hole, and the third hole has a planarized face.

10. The display device of claim 1, wherein each of the first hole and the second hole is located inside an area corresponding to the third hole.

11. The display device of claim 1, wherein the substrate includes a display area and a non-display area,
wherein the display area includes a light-emitting area and a light-transmissive area,
wherein the auxiliary electrode overlaps the light-transmissive area.

12. The display device of claim 11, wherein the display device further comprises a low-potential power line extending across the display area and not overlapping the light-emitting area,
wherein the auxiliary electrode protrudes from the low-potential power line toward the light-transmissive area.

13. A display device comprising:
a substrate:
an auxiliary electrode disposed on the substrate;
a passivation layer disposed on the auxiliary electrode;
an overcoat layer disposed on the passivation layer;
a bank layer disposed on the overcoat layer;
an organic light-emitting layer disposed on the bank layer; and
a cathode electrode disposed on the organic light-emitting layer,
wherein the auxiliary electrode includes an auxiliary electrode contact, wherein at least a portion of the auxiliary electrode contact is exposed through holes respectively extending through the passivation layer, the overcoat layer, and the bank layer,
wherein the organic light-emitting layer and the cathode electrode extend to the auxiliary electrode contact, and
wherein a portion of the overcoat layer surrounding the auxiliary electrode contact includes a pair of overcoat overhang structures.

14. The display device of claim 13, wherein a pair of undercuts are respectively defined below the pair of overcoat overhang structures,
wherein the pair of undercuts are formed by partially removing the passivation layer.

15. The display device of claim 14, wherein the pair of undercuts are arranged to face each other.

16. The display device of claim 13, wherein a bank protrusion from the bank layer is disposed on each of the overcoat overhang structures,
wherein the overcoat overhang structure protrudes beyond the bank protrusion.

17. The display device of claim 13, wherein a portion of the overcoat layer surrounding the auxiliary electrode contact includes an overcoat step,
wherein a bank step is disposed on the overcoat step such that the overcoat layer is partially exposed,
wherein a passivation step is disposed under the overcoat step such that the passivation layer is partially exposed,
wherein the organic light-emitting layer and the cathode electrode extend along and on the bank step, the overcoat step, and the passivation step and then are disposed on the auxiliary electrode contact.

18. The display device of claim 17, wherein each of the bank step, the overcoat step, and the passivation step has a taper shape in which a horizontal dimension at a top face thereof is smaller than a horizontal dimension at a bottom face thereof.

19. The display device of claim 17, wherein the bank step, the overcoat step, and the passivation step are sequentially stacked such that a first spacing between the bank step and the auxiliary electrode is larger than a second spacing between the overcoat step and the auxiliary electrode, and the second spacing is larger than a third spacing between the passivation step and the auxiliary electrode.

20. The display device of claim 17, wherein a portion of the cathode electrode disposed on the auxiliary electrode contact is in contact with the auxiliary electrode in an area corresponding to at least one of the undercuts.

21. The display device of claim 13, wherein a bottom face of the overcoat layer is in direct contact with the passivation layer,
wherein a top face of the overcoat layer is in direct contact with the bank layer.

22. The display device of claim 2, wherein the substrate includes light-emitting areas and light-transmissive areas,
wherein the light-emitting areas and the light-transmissive areas are alternately arranged in the first direction,
wherein the pair of undercuts face each other along the first direction.

23. The display device of claim 2, wherein the substrate includes a plurality of light-emitting areas and a plurality of light-transmissive areas,
wherein the plurality of light-emitting areas are consecutively arranged in the second direction, or the plurality of light-transmissive areas are consecutively arranged in the second direction,
wherein the pair of passivation exposure areas face each other along the second direction.

24. A display device comprising:
a light-transmissive area adjacent to a light-emitting area;
an auxiliary electrode disposed in the light-transmissive area;
a passivation layer on the auxiliary electrode, the passivation layer exposing a top surface of the auxiliary electrode;
an overcoat layer on the passivation layer, the overcoat layer including an overcoat overhang structure that overlaps the exposed top surface of the auxiliary electrode; and a light-emitting layer on the overcoat layer and the overcoat overhang structure, the light-emitting layer contacting the exposed top surface of the auxiliary electrode.

25. The display device of claim 24, wherein the overcoat layer exposes a top surface of the passivation layer, and
wherein the light-emitting layer contacts the exposed top surface of the passivation layer and a side surface of the passivation layer.

26. The display device of claim 25, further comprising:
a bank layer between the light-emitting layer and the overcoat layer,
wherein the bank layer exposes a top surface of the overcoat layer and the overcoat overhang structure, and
wherein the light-emitting layer contacts the exposed top surface of the overcoat layer.

27. The display device of claim 26, further comprising:
a cathode electrode on the light-emitting layer,
wherein the cathode electrode extends below the overcoat overhand structure and contacts the exposed top surface of the auxiliary electrode.

28. A display device comprising:
a sub-pixel configured to emit light among a red, green, blue, and white light and forming a light-emitting area;
a thin film transistor overlapping the sub-pixel, the thin film transistor including a source electrode and a drain electrode;
a light-transmissive area adjacent to the light-emitting area;
an auxiliary electrode disposed in the light-transmissive area;
a light-emitting layer contacting a top surface of the auxiliary electrode;
an anode electrode including a first portion that contacts the top surface of the auxiliary electrode and a second portion that is spaced apart from the top surface of the auxiliary electrode, the first portion and the second portion being continuous and contiguous to each other; and
a cathode electrode on the light-emitting layer, a side surface of the cathode electrode contacting the top surface of the auxiliary electrode.

29. The display device of claim 28, wherein the source electrode, the drain electrode, and the auxiliary electrode are made of a same material during a same process.

30. The display device of claim 28, wherein the light-emitting layer contacts a top surface of the second portion of the anode electrode.

31. The display device of claim 30, wherein the cathode electrode contacts a side surface of the second portion of the anode electrode.

32. The display device of claim 28, wherein the second portion of the anode electrode includes an anode overhang structure.

33. A display device comprising:
a substrate;
an auxiliary electrode disposed on the substrate;
a passivation layer disposed on the auxiliary electrode and having a first hole defined therein through which at least a portion of the auxiliary electrode is exposed;
an overcoat layer disposed on the passivation layer and having a second hole defined therein through which the at least a portion of the auxiliary electrode is exposed; and
wherein the first hole and the second hole are arranged such that at least portions thereof overlap each other in a plan view of the display device,
wherein a middle area in a first direction of the first hole overlaps a middle area in a second direction of the second hole, wherein the first direction intersects the second direction.

* * * * *